(12) United States Patent
Suzuki

(10) Patent No.: US 6,885,258 B2
(45) Date of Patent: Apr. 26, 2005

(54) METHOD AND APPARATUS FOR REDUCING RADIANT NOISE ENERGY BY RADIATING NOISE ENERGY FROM A QUASI-GROUND INTO A SIGNAL WIRE

(75) Inventor: Mitsuo Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 94 days.

(21) Appl. No.: 09/858,604

(22) Filed: May 17, 2001

(65) Prior Publication Data

US 2002/0117318 A1 Aug. 29, 2002

(30) Foreign Application Priority Data

May 17, 2000 (JP) ........................................ 2000-144988

(51) Int. Cl.[7] ................................................. H04B 3/26
(52) U.S. Cl. ........................................ 333/12; 333/181
(58) Field of Search .......................... 333/12, 181, 177, 333/182, 185; 361/818

(56) References Cited

U.S. PATENT DOCUMENTS 3,697,896 A * 10/1972 Sarkozi et al. ................ 333/12
3,832,646 A    8/1974 Szabo et al. ................... 330/31
5,220,298 A * 6/1993 Nagase ........................ 333/185
5,321,373 A * 6/1994 Shusterman et al. .......... 333/12
5,969,583 A   10/1999 Hutchison .................... 333/181

FOREIGN PATENT DOCUMENTS

JP          11-307986       11/1999       ............ H05K/9/00

* cited by examiner

Primary Examiner—Benny Lee
(74) Attorney, Agent, or Firm—Young & Thompson

(57) ABSTRACT

An EMI suppression apparatus allowing a common mode radiant noise energy to be reduced without attenuating a normal mode signal level is disclosed. A communication LSI has an earth terminal connected to the housing via a common mode impedance. A common mode choke composed of two coils having a mutual inductance is provided in the housing. One coil connects a signal terminal of the communication LSI to a signal transmission wire. The other coil connects the earth terminal of the communication LSI to the quasi-ground surface of the housing. The common mode chokes causes a common mode radiant noise generated by the common mode impedance to be removed from the signal transmission wire without affecting a normal mode signal flowing through the signal transmission wire.

14 Claims, 30 Drawing Sheets

WIRES BURIED IN THE GROUND

GROUND(EARTH)

WIRES CONNECTED TO HOUSING
(QUASI-GROUND)

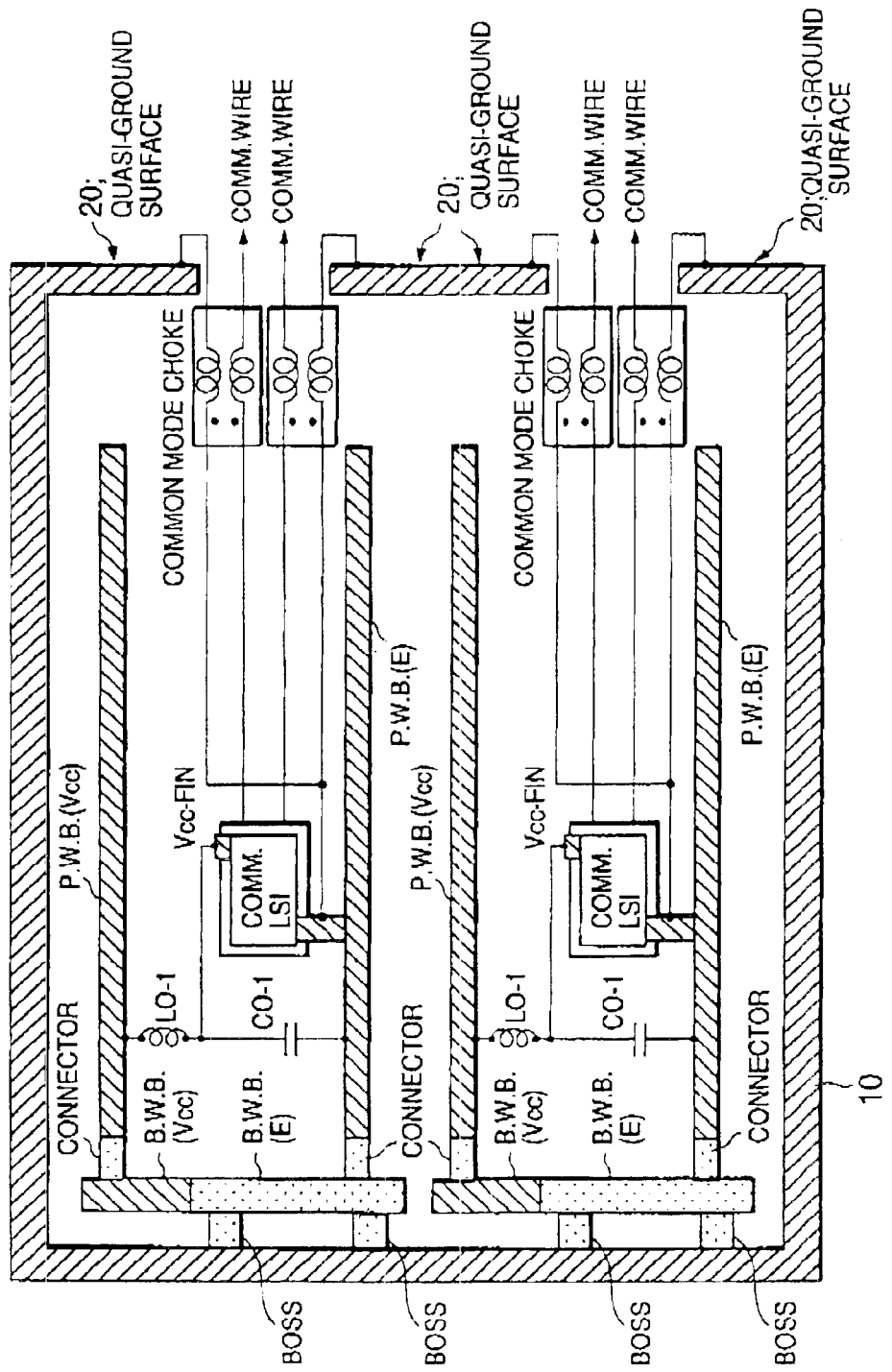

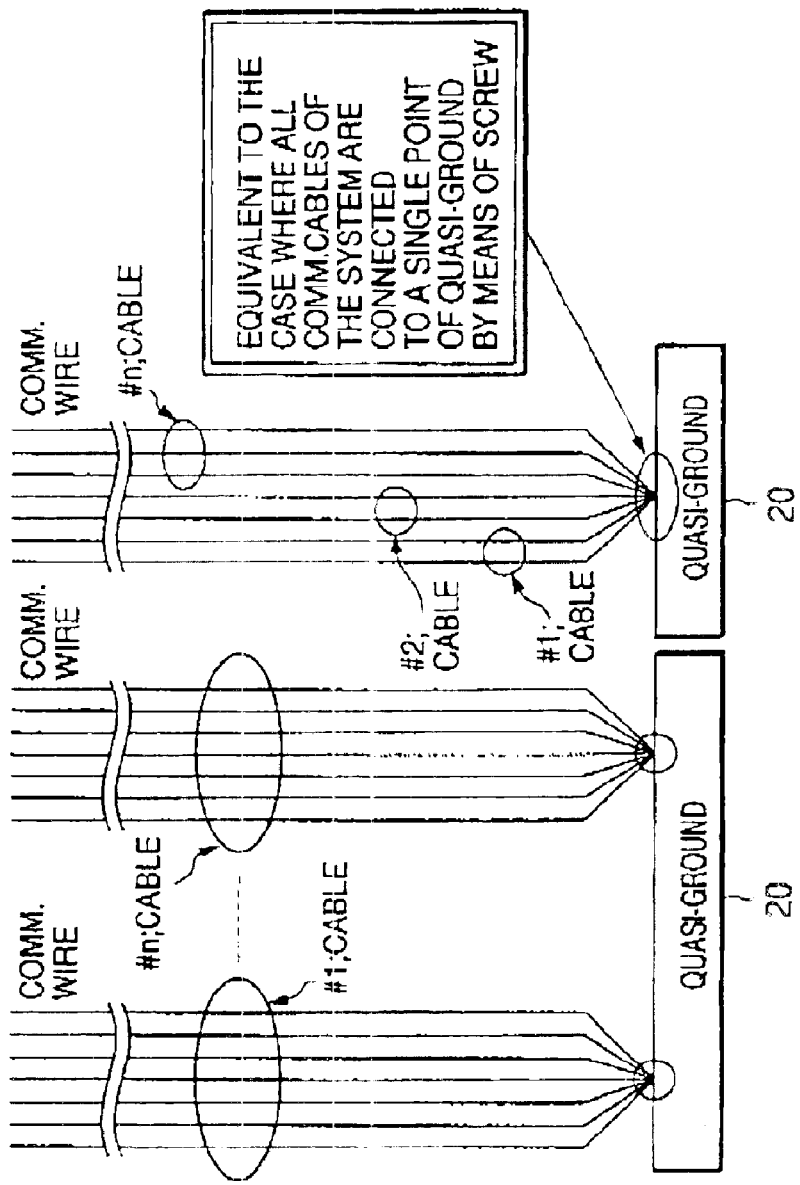

METHOD AND APPARATUS FOR REDUCING RADIANT NOISE ENERGY BY RADIATING NOISE ENERGY FROM A QUASI-GROUND INTO A SIGNAL WIRE

BACKGROUND OF THE INVENTION

1. Field of the Invention

The present invention relates to countermeasures against EMI (electromagnetic interference) in electronic devices, and in particular to a technique of using a quasi-grounding method to reduce radiant noise energy in an electronic device connected to a plurality of cables such as communication wires, power source lines, and interface lines.

2. Description of the Related Art

First, a quasi-grounding method will be described as a background of the invention.

Quasi-Grounding

As shown in FIG. 1, assuming that a hole is dug in the ground 11 and a wire 12 is buried therein, the wire 12 does not radiate any electromagnetic.

As shown in FIG. 2, a housing 10 enabling a radiant noise energy level to be reduced below the regulation value level of EMI, can be regarded as "quasi-ground", and there is no radiated electromagnetic wave from the wire 12 fixed to the housing 10 by means of screw.

Referring to FIG. 3, a housing 10 accommodates a group of communication system packages 21 and a group of control system packages 22. Each of the communication system packages 21 is connected to a communication wire such as a twisted cable extending from a front plate (quasi-ground surface) 20 of the housing 10. The control system packages 22 each have no communication wires and include high-speed central processing units (CPU), memory packages, clock packages, (CLK), and interface packages (INT).

In FIG. 3, a quasi-ground surface 20 is a surface that reduces a radiant noise energy level below the regulation value level of EMI, and does not radiate any electromagnetic wave from the wire fixed thereto.

FIG. 4A is a sectional side view of a communication system package having a communication wire. In FIG. 4A, an earth pin 3E (also referred to as an earth terminal or "E pin") of a communication LSI 3F, a plurality of LSIs (Large Scale Integration) implemented in the package, and an E (earth) pin of an IC component are connected to the housing 10 through an E (earth) 3D of a printed board (PWB), a connector 3C of a back board (BWB), an E (earth) layer 3B of the back board, and bosses 3A.

On the other hand, a power pin 3Q of the communication LSI 3F and a power pin of LSIs and IC components implemented in the package are connected to the contact point of one end of a decoupling inductance 3N and one end of a capacitor 3P. The other end of capacitor 3P is connected with E (earth) 3D of the printed board (PWB). The other end of inductance 3N is connected with a power layer 3M of the printed board via a connector 3L and a power layer 3K of the back board.

Also, the communication wires 3H and 3J, connected with communication output pins 8H and 8J of the communication LSI 3F through a common mode choke 3G, are taken outwards from the housing 10 via an hole opened on the quasi-ground surface 20 of the front side of the housing 10.

Here, the E (earth) 3D of the printed board and the power 3M of the printed board are respectively an E (earth) layer and a power layer on the printed board of the package having the same communication wire connected thereto.

Radiant Noises

By the way, there are two kinds of noise energies radiated from the communication wires 3H and 3J: one is a normal mode noise current having a noise current with a same level that goes between communication wires; and the other is a common mode noise current flowing in the same direction through the communication wires 3H and 3J.

The normal mode noise current is a noise energy generated by an individual communication LSI of each communication wire package. On the other hand, the common mode noise energy is an energy obtained by combining all of earth noises generated by the control system packages 22 and the communication system packages 21, which are accommodates in the housing 10 of FIG. 3. The common mode noise energy is much larger than that of the normal one, and therefore it is the biggest factor of radiation as if the communication wire is a monopole antenna.

As will be described later, the present invention provides a method and device allowing a reduction of the common mode noise to mainly induce radiant noises. The common mode noise will be described below in detail.

Common Mode Noise

FIG. 5 shows an outline of impedance factors causing a great common mode noise between the quasi-ground 20 and the E (earth) pin 3E of the communication LSI 3F.

Referring to FIG. 5, the presence of impedance (housing impedance) of a metallic member composing the housing IC is a big factor that the common mode noise is generated between the housing 10 and the quasi-ground surface 20 with the smallest noise energy.

The E (earth) current flows through the impedance (boss-E impedance) of a plurality of metallic bosses 3A from the E (earth) layer 3B of the back board (BWB), and thereby a common mode noise is generated at this boss-E impedance.

The E (earth) current from all packages of the control system packages 22 and the communication system packages 21 flows through the impedance (BWB-E impedance) of the E (earth) layer 3B of the back board, and thereby a common mode noise is caused.

The current branching out from the E (earth) 3D of the printed board of the communication system packages flows through the impedance (connector-E impedance) of a plurality of E (earth) pins of the connector 3C, and thereby a common mode noise is caused.

The current from many LSI or IC components implemented to this package flows through the impedance (PWB-E impedance) of the E (earth) 3D provided on the printed board (PWB) of a package having a communication wire, and thereby a common mode noise is caused.

As shown in FIG. 6A, therefore, when the E (earth) currents flow through many kinds of above-described impedances existing between the quasi-ground surface 20 and the E (earth) pin of communication LSI 3F, which is indicated by a common impedance 40 in FIG. 5, a large amount of common mode noise energy as denoted by a reference numeral 51 of FIG. 6B exists in the E (earth) pin 3E of communication LSI 3F implemented to the printed board of the package having communication wire. Since the communication. LSI 3F functions with respect to this E pin 3E, the large amount of common mode noise 51 (see FIG. 6) generated in the common impedance 40 is radiated as it is towards the communication wires 3H, 3J connected with the communication output pins 8H, 8J of the communication LSI 3F.

FIGS. 6(*a*) and 6(*b*) each show a relationship between the common impedance 40 and the quasi-ground 20, wherein FIG. 6(a) schematically shows components forming the common impedance 40.

Since the internal E (earth) of communication LSI 3F as shown in FIG. 6(b) works with respect to the E pin 3E, the common mode noise on the internal E (earth) of communication LSI 3F, that is, the common mode noise 51 on E pin 3E of communication LSI 3F is radiated as it is to the communication wire output pins 8H, 8J of communication LSI 3F. Therefore, the internal E (earth) of communication LSI 3F and the E (earth) pin 3E can be recognized as a common E (earth) 50 as shown in FIG. 6(c) and it can be also regarded that the communication wire output pins 8H, 8J of communication LSI 3F are also connected to the common E (earth) 50.

As shown in FIG. 6(c), if the communication LSI 3F is omitted, an equivalent configuration in which the common mode choke 3G inputs the same common mode noise 51 is obtained. As the result, the communication wires 3H, 3J play the role of a monopole antenna connected to the quasi-ground surface 20 to radiate the noise energy exceeding the regulation value.

As described before, this radiant noise energy means the direct radiation of common mode noise energy 51 caused by the E (earth) current flowing through the common mode impedance 40.

The description of electric field intensity, which is selected because of easy theoretical analysis although electromagnetic wave is composed of electric field and magnetic field, is shown in FIG. 7.

An electric field strength E (V/m) can be obtained by the following formula:

$$E=12.6\times10^{-7} f\cdot h\cdot i/d(V/m) \propto f\cdot h\cdot i/d(V/m) \quad (1),$$

where i: a current value (A), h: antenna height (m), and f: frequency (Hz), and d: distance (m) away from the monopole antenna.

In order to make this electric field intensity E smaller, current i, antenna height h, and frequency f are made smaller, and/or distance d greater.

In order to equivalently set the current i longitudinally flowing through he antenna to zero, a pair of quasi-grounding capacitors are employed in a conventional communication system package as shown in FIG. 8.

Conventional Circuit Configuration

There has been proposed a quasi-grounding method and device in Japanese Patent Application Unexamined Publication No. 11-30798, which was filed by Suzuki (the present inventor) et al. The details thereof will be described hereafter.

As shown in FIG. 8, a capacitor 60 having a property of high frequency is connected between the quasi-ground surface 20 and a point 6H connecting one coil of common mode choke 3G with the communication wire 3H, and a capacitor 61 having a property of high frequency is connected between the quasi-ground surface 20 and a point 6J connecting the other coil of common mode choke 3G with the communication wire 3J. The capacitors 60, 61 are hereinafter called quasi-grounding capacitors because the respective capacitors 60 an 61 make short circuits in a high frequency range between the communication wires 3H, 3J and the housing. As the result, the radiant noise energy level of the communication wires 3H and 3J are substantially equal to that of the quasi-ground (housing) 20.

In other words, the quasi-grounding capacitors 60, 61 cause the radiant noise energy to flow into the quasi-ground surface 20 to short-circuit the common impedance in high frequencies, preventing common mode noise energy 51 from being generated. The example shown in FIG. 8 is composed to combine the common mode choke 3G with the quasi-grounding capacitors 60, 61 so that a large amount of common mode noise energy is eliminated effectively.

FIG. 9A shows a sectional view of a conventional package having the circuit configuration as shown in FIG. 8. Compared with the circuit configuration of FIG. 4A, the quasi-grounding capacitors 60, 61 are additionally connected between the communication wires 3H, 3J and the quasi-ground surface 20.

Since the radiant noise energy of communication wires 3H, 3J flows into the quasi-ground surface 20 through the quasi-grounding capacitors 60, 61, with the increase of number of communication system packages 21 accommodated in the housing 10, the radiant noise energy level 30 of quasi-ground surface 20 is also increased (see FIG. 9B). In this case, even if all of the communication system packages 21 are accommodated in the housing, it is necessary to keep the radiated noise energy level 30 of the quasi-ground surface 20 within the regulation value 70. For this purpose, various countermeasures against noise energy (EMI) have been employed for each internal circuit accommodated in he housing, such as back board, control system packages, and communication system packages.

According to the conventional method described referring to FIGS. 8 and 9A, 9B, the quasi-grounding can be effectively realized in the case where a common mode radiant noise energy of 30 MHz or more is reduced from analog communication wires for a voice frequency band of 4 KHz or less. The reason is that a frequency difference between the voice signal on the communication wires and the noise energy to be eliminated is large. Therefore, after the common mode radiant noise energy is removed by the common mode choke 3G and the quasi-grounding capacitors 60, 61, the normal mode signal level is not substantially reduced.

Here, the frequency of 30 MHz is adopted because the radiant noise of 30 MHz or more is regulated by the International Special Committee on Radio Interference (CISPR) international standards, the Voluntary Control Council for Interference by Information Technology Equipment (VCCI) domestic standards, the FCC federal standards, and the EN55022 European standards.

However, with the increase of signal speed on digital communication wires, for example, a gigabit Ethernet with a transmission rate of Giga bps order in recent years, the frequency difference between the signal and the common mode noise is getting smaller. Accordingly, the quasi-grounding capacitors employed in the prior art cause the normal mode signal level on the communication wires to be also attenuated when the frequency of a signal on communication wires is increased to near that of the common mode noise.

Now it is required to develop such a technology that can achieve an economical countermeasure against EMI under high-speed transmission on communication wires with reliability and stability.

SUMMARY OF THE INVENTION

An object of the present invention is to provide a method and apparatus for taking countermeasures against EMI, that allows a common mode radiant noise energy to be reduced without attenuating a normal mode signal level of communication wire and reducing the high-speed transmission.

Other objects, characteristics, advantages and the like of the present invention may be apparently understood from the following embodiments described in the disclosure.

According to the present invention, a method for suppressing a radiant noise of an electronic circuit having at least one signal transmission wire connected thereto, wherein the electronic circuit includes an electronic device having an earth terminal and at least one signal terminal, the earth terminal being connected to a housing of the electronic circuit via a common mode impedance, includes the steps of: forming a plurality of current paths such that a first current path affects any other current path corresponding to one of said at least one signal transmission were; transmitting an output signal of an electronic device to a corresponding signal transmission wire through a corresponding one of he current paths; flowing a current between an earth terminal of the electronic device and a quasi-ground through the first current path; and suppressing a common mode radiant noise included in the output signal by flowing the current through the first current path.

The plurality of current paths may be formed by a common mode choke having a plurality of coils corresponding to respective ones of the current paths.

The plurality of current paths may be formed by a ferrite bead having a plurality of through holes corresponding to respective ones of the current paths, wherein each of the current paths is passed through a corresponding one of the through holes.

Alternatively, the plurality of current paths may be formed by a resistor and at least one operational amplifier, which correspond to respective ones of the current paths, wherein the resistor is inserted in the first current path to generate a reference voltage from the current flowing the first current path, and said at least one operational amplifier inputs the reference voltage at a non-inverting input terminal thereof.

According to another aspect of the present invention, an electronic apparatus includes: a housing having at least one signal transmission wire extending to outside the housing; an electronic device having an earth terminal and at least one signal terminal corresponding to the at least one signal transmission wire, wherein the earth terminal is connected to the housing via a common mode impedance; at least one common mode choke having a plurality of coils having a mutual inductance, wherein one of the plurality of coils connects a signal terminal of the electronic device to a corresponding signal transmission wire; and another one of the plurality of coils connects the earth terminal of the electronic device to a quasi-ground surface of the housing.

According to an embodiment, the electronic device has the earth terminal and first and second signal terminals corresponding respectively to first and second signal transmission wires, wherein a first common mode choke having first and second coils having a mutual inductance, wherein the first coil connects the first signal terminal of the electronic device to the first signal transmission wire; and the second coil connects the earth terminal of the electronic device to a quasi-ground surface of the housing, and a second common mode choke having third and fourth coils having a mutual inductance, wherein the third coil connects the second signal terminal of the electronic device to the second signal transmission wire; and the fourth coil connects the earth terminal of the electronic device to the quasi-ground surface of the housing, wherein the first and second common mode chokes cause a common mode radiant noise generated by the common mode impedance to be removed from the first and second signal transmission wires without affecting a normal mode signal flowing through the first and second signal transmission wires in opposite directions to each other.

According to further another aspect of the present invention, an electronic apparatus includes: a housing having at least one signal transmission wire extending to outside the housing; an electronic device having an earth terminal and at least one signal terminal corresponding to the at least one signal transmission wire, wherein the earth terminal is connected to the housing via a common mode impedance; at least one ferrite bead having a plurality of holes therein, wherein a signal wire connecting a signal terminal of the electronic device to a corresponding signal transmission wire is passed through one of the plurality of holes; and another signal wire connecting the earth terminal of the electronic device to a quasi-ground surface of the housing is passed through another one of the plurality of holes.

According to an embodiment, the electronic device may have the earth terminal and first and second signal terminals corresponding respectively to first and second signal transmission wires, wherein a first ferrite bead having first and second holes, wherein a first signal wire connecting the first signal terminal of the electronic device to the first signal transmission wire is passed through the first hole; and a second signal wire connecting the earth terminal of the electronic device to a quasi-ground surface of the housing is passed through the second hole, and a second ferrite bead having third and fourth holes, wherein a third signal wire connecting the second signal terminal of the electronic device to the second signal transmission wire is passed through the third hole; and a fourth signal wire connecting the earth terminal of the electronic device to the quasi-ground surface of the housing is passed through the fourth hole, wherein the first and second ferrite beads cause a common mode radiant noise generated by the common mode impedance to be removed from the first and second signal transmission wires without affecting a normal mode signal flowing through the first and second signal transmission wires in opposite directions to each other.

According to another embodiment, the electronic device may have the earth terminal and a plurality of signal terminals corresponding respectively to a plurality of signal transmission wires, wherein the ferrite bead having a plurality of first holes and a second hole, wherein a plurality of signal wires each connecting the signal terminals of the electronic device to the signal transmission wires are passed through respective ones of the first holes; and a signal wire connecting the earth terminal of the electronic device to the quasi-ground surface of the housing is passed through the second hole.

According to still another aspect of the present invention, an electronic apparatus includes: a housing having at least one signal transmission wire extending to outside the housing; an electronic device having an earth terminal and at least one signal terminal corresponding to the at least one signal transmission wire, wherein the earth terminal is connected to the housing via a common mode impedance; a resistor for generating a reference voltage from a current flowing between the housing and the earth terminal of the electronic device; and at least one operational amplifier having an inverting input terminal connected to a corresponding signal terminal of the electronic device, wherein the reference voltage is inputted at a non-inverting input terminal thereof.

According to an embodiment, the electronic device may have the earth terminal and first and second signal terminals corresponding respectively to first and second signal transmission wires, wherein a first resistor for generating a first reference voltage from a first current flowing between the housing and the earth terminal of the electronic device; and a first operational amplifier having a first inverting input terminal connected to the first signal terminal of the electronic device, wherein the first reference voltage is applied to a first non-inverting input terminal thereof, and a second resistor for generating a second reference voltage from a second current flowing between the housing and the earth terminal of the electronic device; and a second operational amplifier having a second inverting input terminal connected to the second signal terminal of the electronic device, wherein the second reference voltage is applied to a second non-inverting input terminal thereof, wherein the first and second operational amplifiers cause a common mode radiant noise generated by the common mode impedance to be removed from the first and second signal transmission wires without affecting a normal mode signal flowing through the first and second signal transmission wires in opposite directions to each other.

BRIEF DESCRIPTION OF THE DRAWINGS

FIG. 16 is a sectional view of a device according to a second example of the first embodiment;

FIGS. 21A and 21B are diagrams explaining the second example of the first embodiment;

DESCRIPTION OF THE PREFERRED EMBODIMENTS

The conventional device disclosed in Japanese Patent Application Unexamined Publication No. 11-307986 (see FIGS. 8 and 9) uses quasi-grounding capacitors to reduce a common mode radiant noise level within regulation.

In contrast, an electronic device according to the present invention uses a common mode choke to reduce a common mode radiant noise level within regulation without reducing a normal mode signal level even in the case of a higher frequency of a normal mode signal.

Figure 22:
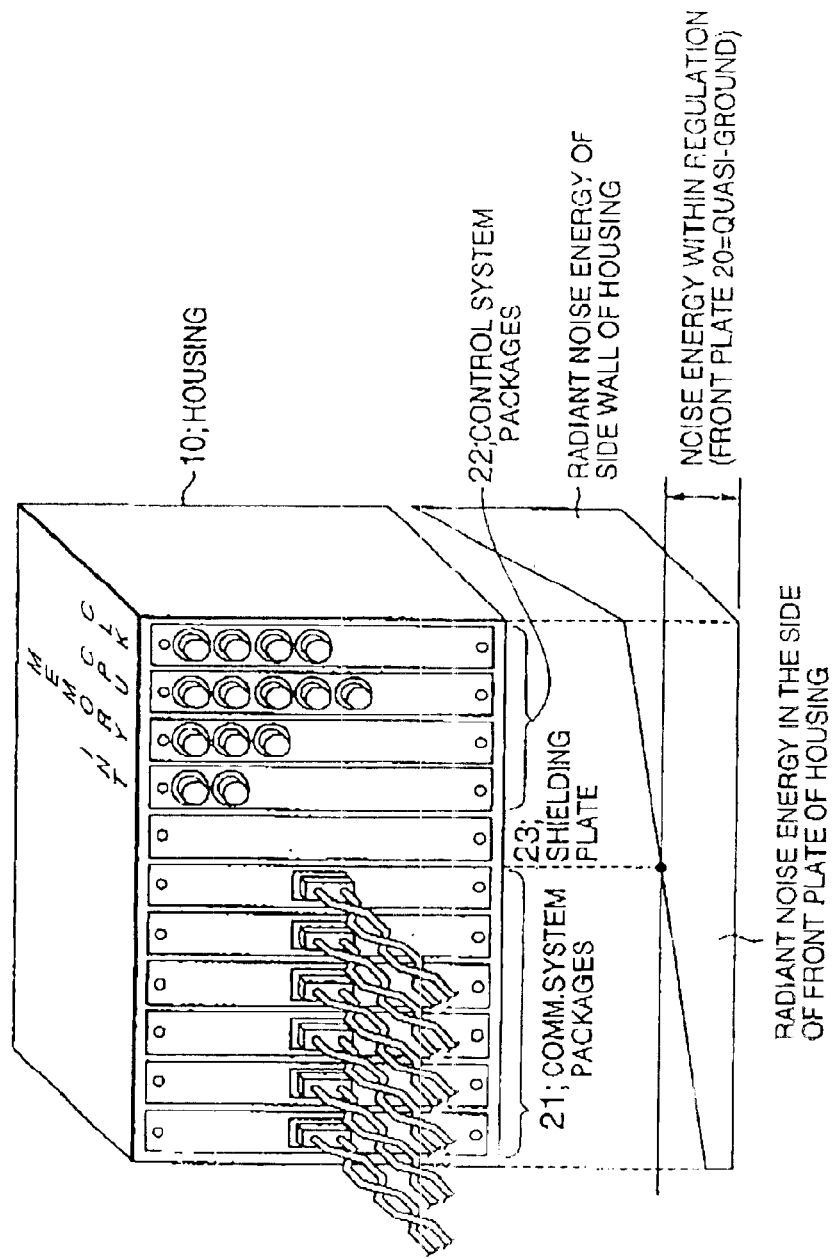
FIG. 22 is a perspective view of a device according to a third example of the first embodiment.

Further, according to the present invention, the communication system packages 21 are separated from the control system packages 22 by a shielding plate 23 (see FIG. 22). Since the communication system packages 21 work at lower speeds compared with the control system packages 22, it is easy to make the noise energy on the communication wires 3H and 3J smaller than the quasi-ground 20 (see FIG. 22), although the quasi-ground surface 20 provides a large amount of radiant noise energy from the control system packages 22 and communication system packages.

Hereafter, it is assumed for simplicity that the radiant noise energy flows from the communication wire side 3H, 3J into the quasi-ground surface 20. This assumption provides the case being reversed to the conventional case as disclosed in the Japanese Patent Application Unexamined Publication No. 11-307986 where the radiant noise energy from the housing flows into the communication wires through the quasi-grounding capacitors.

As a matter of course, the arrangement similar to the conventional case may be formed, where the wires have a smaller radiant noise energy than that of the quasi-ground housing and a plurality of wires having smaller radiated noise energies than that of the quasi-ground housing are connected to the quasi-ground housing through quasi-grounding capacitors at high-frequency range. Since the current flows from the housing with a high noise energy level to the wire with a low high-frequency noise energy level, the noise energy level of the quasi-ground point of housing is reduced and the high-frequency noise energy is not increased regardless of the increase of the number of communication wires.

In the embodiments as described hereinafter, in the connected state of all communication wires provided in the device, the radiant noise energy level of housing is assumed to be equal to or smaller than the radiant noise regulation value, although the increase of number of communication wires causes the radiant noise energy of the housing (quasi-ground) to be increased.

First Embodiment

Circuit Configuration

Figures 9A, 9B:
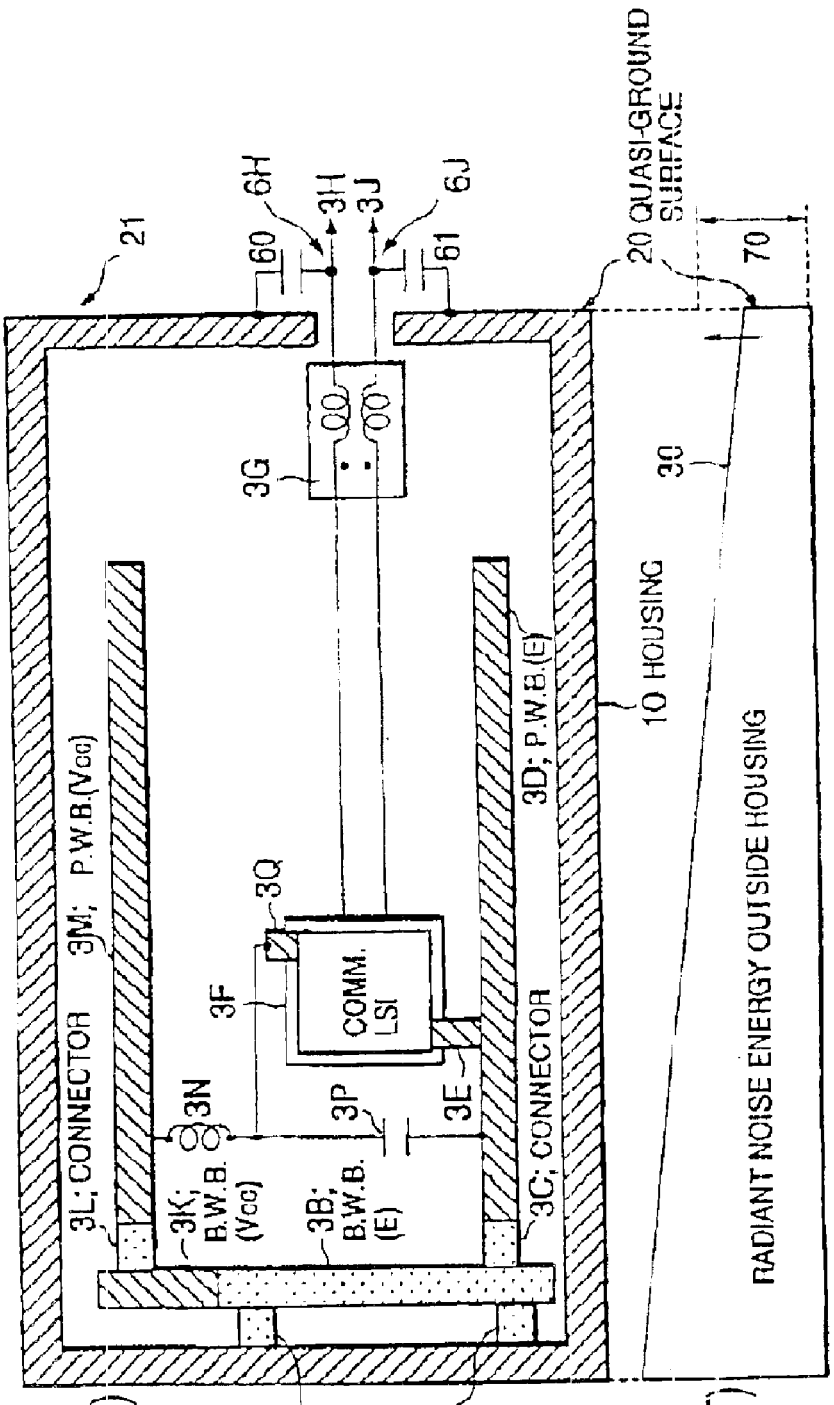
FIG. 9A is a sectional view of the conventional device.
FIG. 9B is a diagram showing a change of radiant noise energy outside the housing in the conventional device.
Figures 10A, 10B:
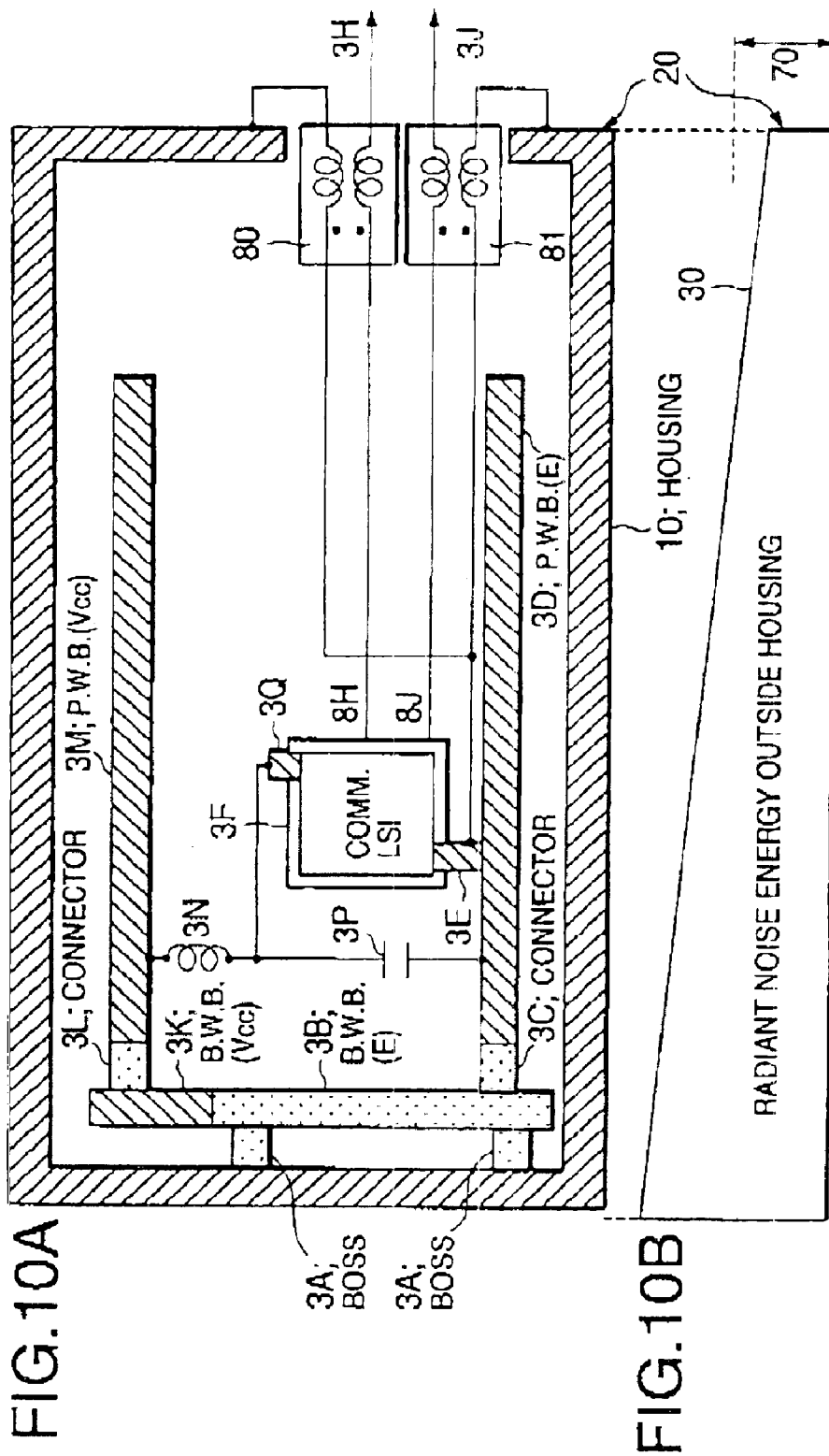
FIG. 10A is a sectional view of a device according to a first example of a first embodiment of the present invention.
FIG. 10B is a diagram showing a change of radiant noise energy outside the housing in the first embodiment of the present invention.

Referring to FIG. 10A, common mode chokes are connected between the quasi-ground surface 20 and the E pin 3E of the communication LSI 3F. In FIG. 10A, components similar to those previously described with reference to FIG. 9A are denoted by the same reference numerals or symbols and the details will be omitted. In FIG. 10B, a radiant noise energy level 30 outside the housing 10 (see FIG. 10A) is shown, wherein the reference numeral 70 indicates the regulation value.

In the first embodiment of the present invention as shown in FIG. 10A, one coil of common mode choke 80 is inserted between the communication output pin 8H of communication LSI 3F and the communication wire 3H, and one end of the other coil of the common mode choke 80 is connected to the quasi-ground surface 20 and the other end of the other coil is connected to an E (earth) pin 3E of the communication LSI 3F.

Similarly, one coil of common mode choke 81 is inserted between the communication output pin 8J of the communication LSI 3F and the communication wire 3J, and one end of the other coil of the common mode choke 81 is connected to the quasi-ground surface 20 and the other end of the other coil as connected to the E (earth) pin 3E of the communication LSI 3F.

Figure 11:
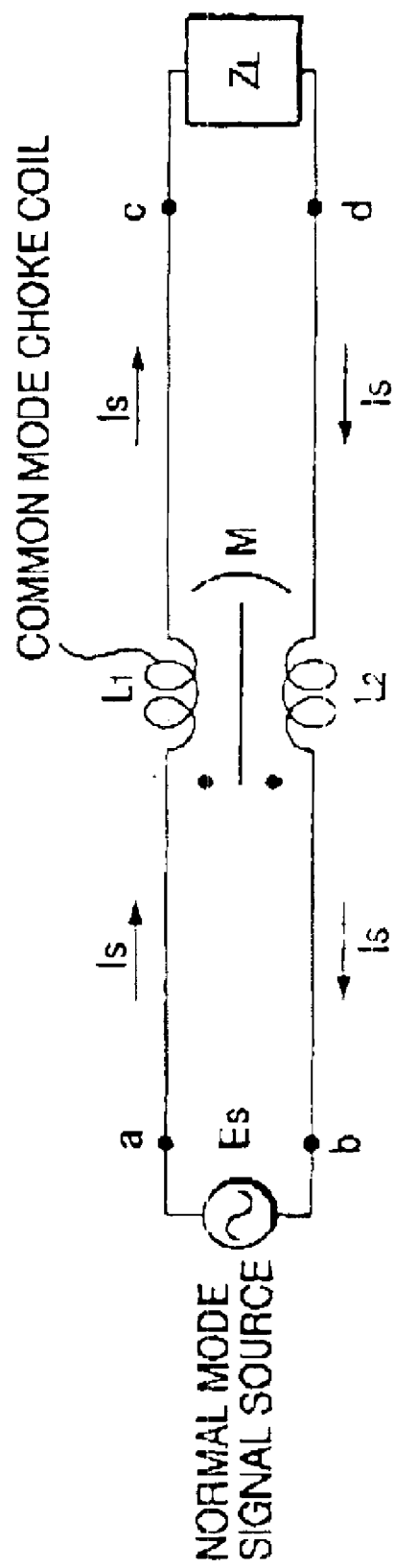
FIG. 11 is a diagram explaining the first embodiment of the present invention.
Figure 12:
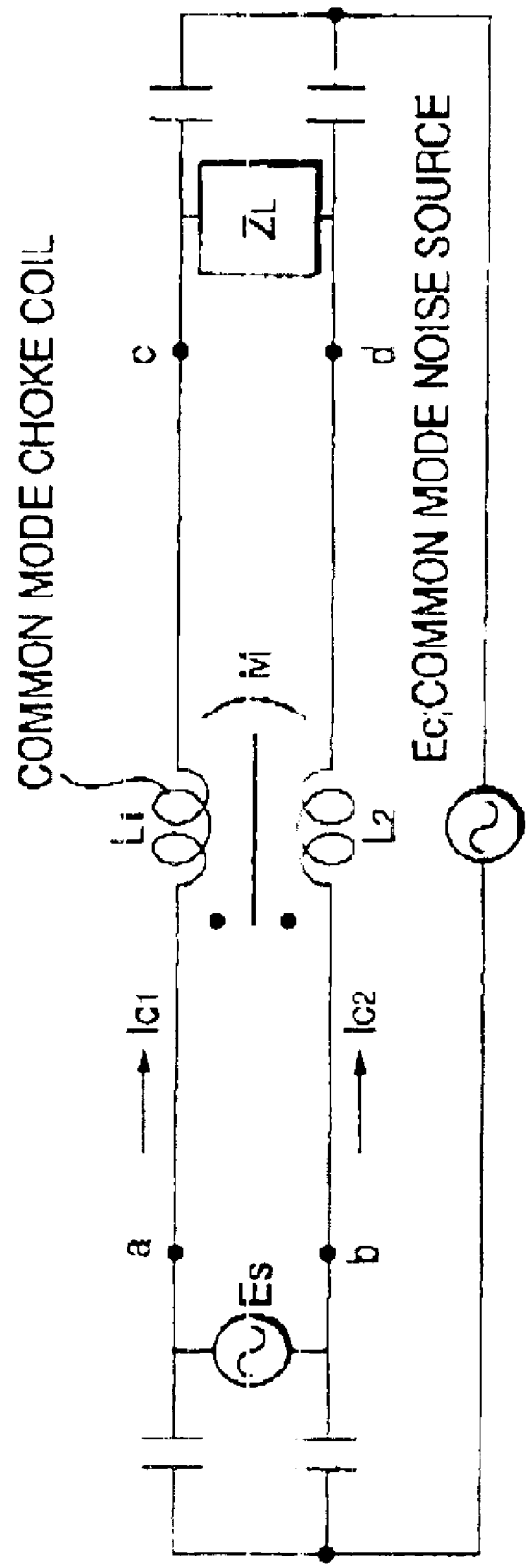
FIG. 12 is a diagram explaining the first embodiment of the present invention.

In order to understand easily the circuit configuration as shown in FIG. 11A, the property of the common mode chokes 80 and 81 is theoretically analyzed referring to FIGS. 11 and 12.

Common Mode Choke

1. Normal Mode Signal

Referring to FIG. 11, in the case where common mode choke coils L1 and L2 receive a normal mode signal from a normal mode signal source Es, the load of the normal mode signal source Es is only a load impedance $Z_L$, which means the absence of the common mode choke, resulting in no reduction in the normal mode signal level. When a current $I_S$ flows from the normal mode signal source $E_S$ to the load $Z_L$, the direction of the current flowing through the common mode choke coil L1 is opposite to that of the current flowing through the common mode choke coil L2.

Assuming that the respective common mode choke coils L1 and L2 have self-inductances of L1 and L2, a mutual inductance of M, a voltage $E_{ab}$ between terminals a and b is represented by:

$$E_{ab}=(-j\omega M+j\omega L1+Z_L+j\omega L2-j\omega M)I_S \quad (2),$$

where $j^2=-1$ and $\omega=2\pi f$ (f is a frequency).

Assuming that a coupling coefficient is 1, $$M=L1=L2$$

$$E_{ab}=Z_L \cdot I_S \quad (3).$$

In other words, the load impedance viewed from the terminals a and b remains $Z_L$ without any change even if the common mode choke coils are inserted.

2. Common Mode Noise

Referring to FIG. 12, the case where a common mode noise current is supplied from a common mode noise source $E_C$ will be described.

A voltage $E_{ac}$ between terminals a and c is represented by:

$$E_{ac}=j\omega L1 \cdot I_{c1}+j\omega M \cdot I_{c2} \quad (4).$$

A voltage $E_{bd}$ between terminals b and d is represented by:

$$E_{bd}=j\omega L2 \cdot I_{c2}+j\omega M \cdot I_{c1} \quad (5).$$

Assuming that a coupling coefficient is 1, L1=L2=M. When balanced, $I_{c1}=I_{c2}$ and $$E_{ac}=E_{bd}=2j\omega L1 \cdot I_{c1} \quad (6)$$

In this manner, an impedance of $2j\omega L1$ is added to each wire with respect to the common mode noise, and thereby the common mode noise flowing into the common mode choke coils L1 and L2 in the same direction can be blocked effectively.

Figure 13:
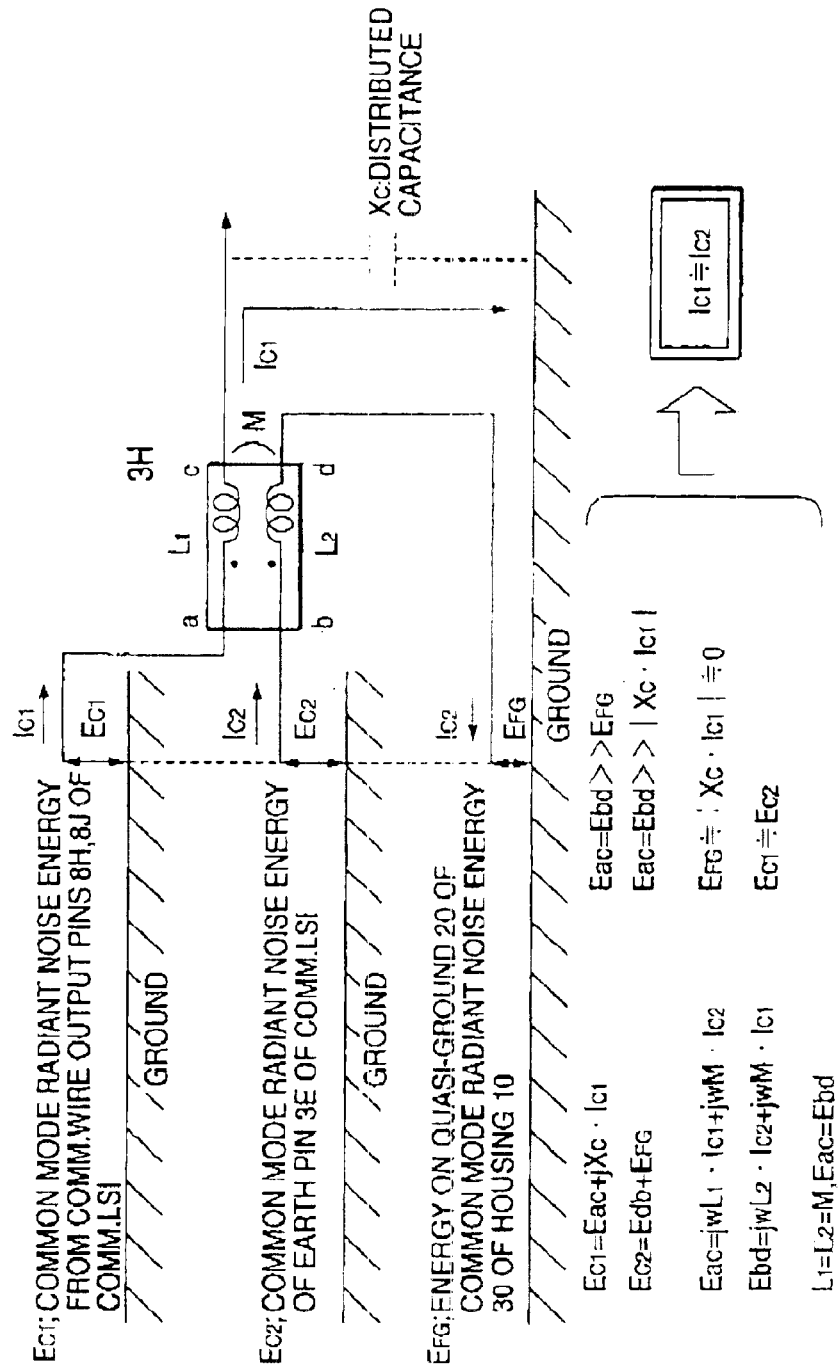
FIG. 13 is a diagram explaining the first embodiment of the present invention.

Referring to FIG. 13, the communication wire pin 8H or 8J of the communication LSI 3F is connected to the communication wire 3H or 3J through the coil L1 of the common mode choke 80 or 81. Further, there is a distributed capacitance Xc between the communication wire 3H or 3J and the ground of the earth. In other words, the communication wire 3H or 3J is connected to the ground by the distributed capacitance Xc at high frequencies. Accordingly, the common mode radiant noise energy $E_{c1}$ at the communication wire pin 8H or 8J causes a current $I_{c1}$ to flow from the communication wire pin 8H or 8J to the ground through the common mode choke coil L1 and the distributed capacitance Xc.

On the other hand, a common mode radiant noise energy $E_{C2}$ at the E (earth) pin 3E of communication LSI 3F flows through the common mode choke coil L2 into the quasi-ground surface 20 having an energy $E_{FG}$ in the common mode radiant noise energy 30 of the housing 10.

Figure 5:
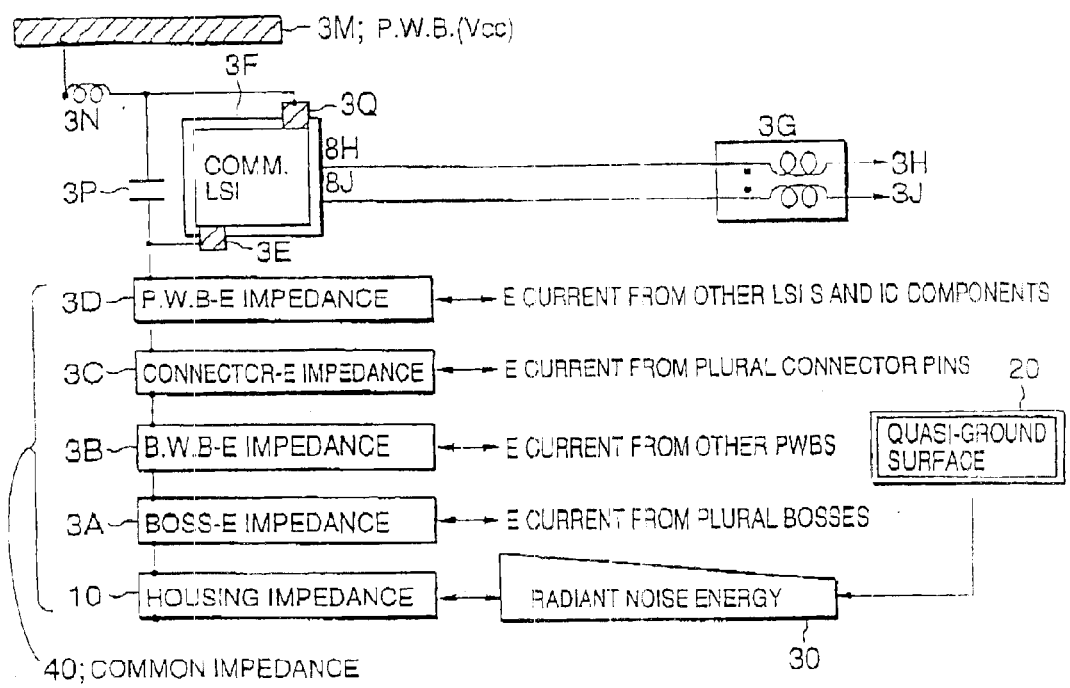
FIG. 5 is a block diagram showing impedances within the housing for explaining a common mode impedance (common mode noise)

The present invention focuses on the following points:

1) LSI functions with respect to the E (earth), and the noise energy levels included in the E (earth) appear as they are on all I/O pins thereof; and
2) The common mode noise 51 on the quasi-ground surface 20 mainly occupies most of the radiant noise energy as described before referring to FIG. 5 and FIG. 6.

More specifically, referring to FIG. 13, the common mode radiant noise energy $E_{C2}$ at the E (earth) pin 3E of communication LSI 3F is included in the common mode radiant noise energy $E_{C1}$ from the communication wire output pins 8H and 8J of communication LSI 3F. Further, the common mode radiant noise energy $E_{C2}$ at the E (earth) pin 3E of communication LSI 3F occupies most of the common mode radiated noise energy from communication wire output pins 8H and 8J.

In other words, since $E_{C1} \approx E_{C2}$, the circuit according to the embodiment of the present invention is provided with a common mode choke coil that is inserted between the quasi-ground surface 20 and the E (earth) pin 3E of communication LSI 3F so as to reduce the radiant noise energy level to the noise energy level of the quasi-ground 20 which is equal to or smaller than the regulation value. The common mode choke coil inserted between the quasi-ground surface 20 and the E (earth) pin 3E cancels or subtracts an excess amount of radiant noise energy with respect to the noise level of the quasi-ground 20 from the radiant noise energy of the pins 8H, 6J of the communication LSI 3F. Accordingly, the radiated noise level from the communication wires is reduced to just the amount corresponding to the energy of quasi-ground surface 20 that is the regulation value or less.

In FIG. 13, assuming that current of the output pins 8H, 8J are referred to as $I_{c1}$, $I_{c2}$, terminal voltage between both ends a, c of common mode choke L1 is as $E_{ac}$, terminal voltage between both ends is as b, d of common mode choke L2 is as $E_{bd}$, the common mode noise energy $E_{c1}$ from the output pins 8H, 8J of communication LSI 3F and the common mode noise energy $E_{c2}$ of E pin 3E of communication LSI 3F are represented by the following equations:

$$E_{c1} = E_{ac} + jX_c \cdot I_{c1} \qquad (7), \text{ and}$$

$$E_{c2} = E_{bd} + E_{FG} \qquad (8).$$

Also, referring to FIG. 12, the terminal voltage $E_{ac}$, $E_{bd}$ are represented by the following equations:

$$E_{ac} = j\omega L1 \cdot I_{c1} + j\omega M \cdot I_{c2} \qquad (9), \text{ and}$$

$$E_{bd} = j\omega L2 \cdot I_{c2} + j\omega M \cdot I_{c1} \qquad (10),$$

where M is the mutual inductance of coils L1 and L2.

In the case of a coupling coefficient of common mode choke being 1, L1=L2=M, and when the balance is kept, $I_{c1} = I_{c2}$ and $$E_{ac} = E_{bd} = 2j\omega L1 \cdot I_{c1} \qquad (11).$$

Accordingly, an impedance of $2j\omega L1$ is applied to each line (signal line) for the common mode noise and thereby the noise flowing into the common mode choke coils L1, L2 in the same direction such as the common mode noise can be effectively blocked.

On the other hand, $jX_c \cdot I_{c1}$, which is a voltage drop $|X_c I_{c1}|$ caused by a current flowing through the distributed capacity impedance $X_c$ equivalently connecting the signal line to the ground, and the noise energy voltage $E_{FG}$ on the quasi-ground surface 20 in the common mode radiant noise energy 30 of the housing 10, are negligible because they are much smaller than $E_{ac} = E_{bd}$, that is, $$|X_c I_{c1}| \approx E_{FG} \approx 0.$$

By substituting this condition and the above equations (9), (10) and (11) into the above equations (7) and (8), the following equation can be obtained:

$$E_{C1} = E_{ac} = E_{C2} = E_{bd} \qquad (12).$$

From the this equation (12), $$I_{c1} = I_{c2} \qquad (13)$$

is obtained. Since an impedance of $2j\omega L1$ is applied to each line for the common mode noise, the noise flowing into the common mode choke coils L1 and L2 in the same direction such as the common mode noise can be effectively blocked.

Equivalent Circuit

Figure 8:
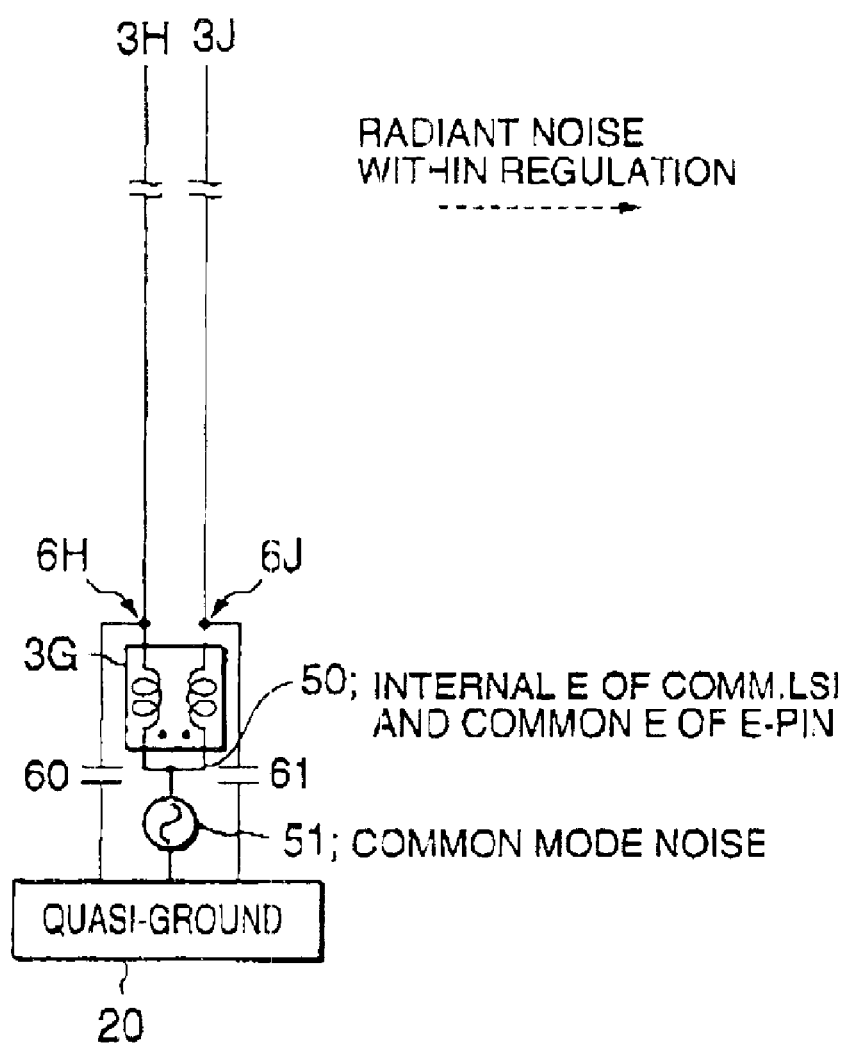
FIG. 8 is a diagram showing a circuit diagram of a conventional device using quasi-grounding capacitors.
Figure 14:
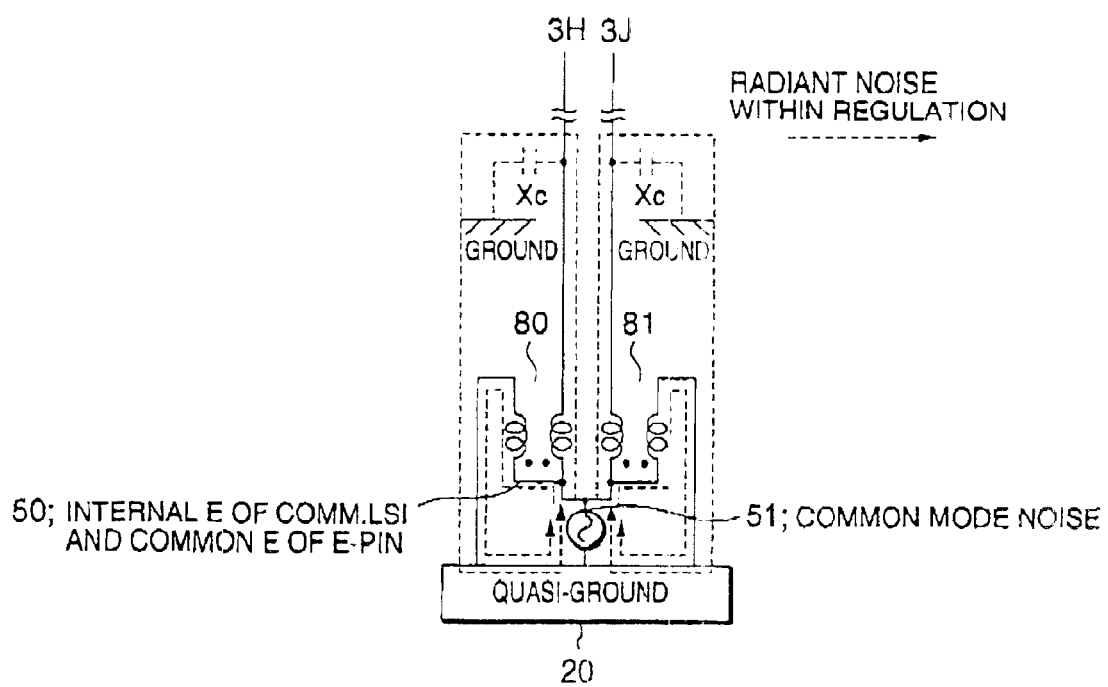
FIG. 14 is a diagram explaining the first embodiment of the present invention.

Referring to FIG. 14, it is possible to regard the communication wires 3H, 3J as a monopole antenna. The common mode chokes 80 and 81 are inserted to cancel the common mode noise 51 from the monopole radiant noise energy of the communication wires 3H, 3J to reduce the radiant noise energy from communication wires 3H, 3J to the noise energy 20 of the quasi-ground surface. This is entirely equivalent to the conventional case using the quasi-grounding capacitor 60, 61 as shown in FIG. 8.

Figures 15A, 15B, 15C:
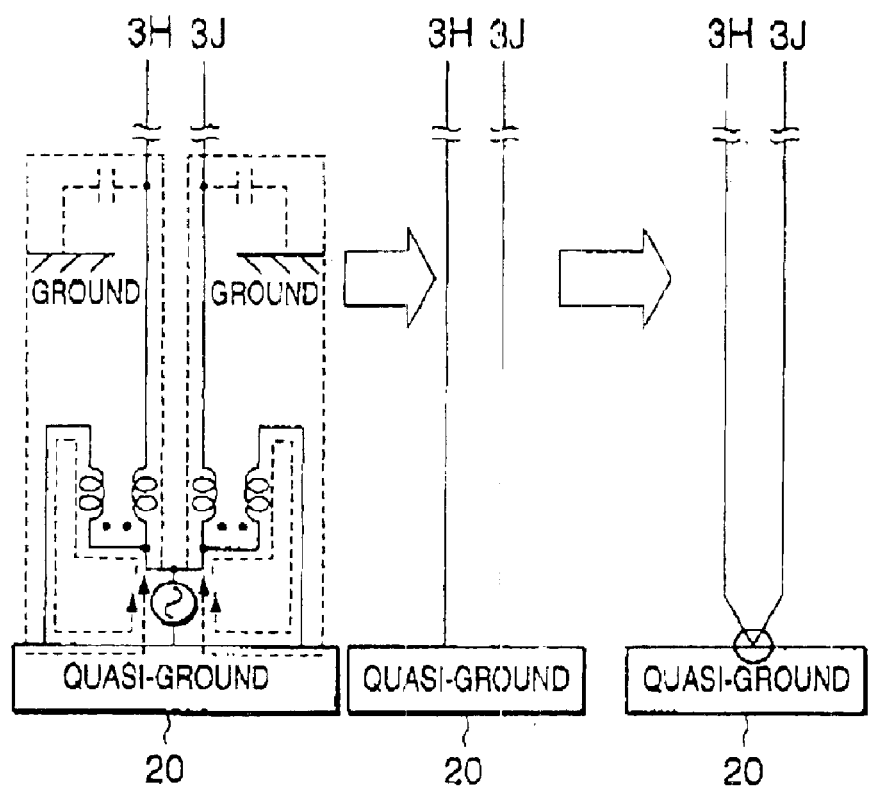
FIGS. 15A, 15B and 15C are diagrams explaining the first embodiment of the present invention.

As shown in FIG. 15B, the quasi-grounding common mode chokes 80 and 81 can remove the common mode noise mainly composed of monopole radiant noise energy from the communication wires 3H, 3J, resulting in the following equation: communication wire energy=housing energy $E_{FG}$=quasi-ground surface energy. Accordingly, it is entirely equivalent to the case where the wires (communication wires) 3H, 3J are fixed by a screw to the housing which is the quasi-ground as shown in FIG. 15(c).

Second Example

Although only one communication line is focused on in the above embodiment, there are some cases where a plurality of communication lines is provided in a single housing.

Referring to FIG. 16, according to another example of the first embodiment of the present invention, a plurality of communication LSIs (here, two LSIs) are provided in the housing 10, and each communication LSI is connected to communication wires through common mode chokes, which connects the E (earth) pin of the corresponding communication LSI to the quasi-ground surface (housing) 20, and further connects the communication output pin of the corresponding communication LSI to the corresponding communication wire.

Figure 17A:
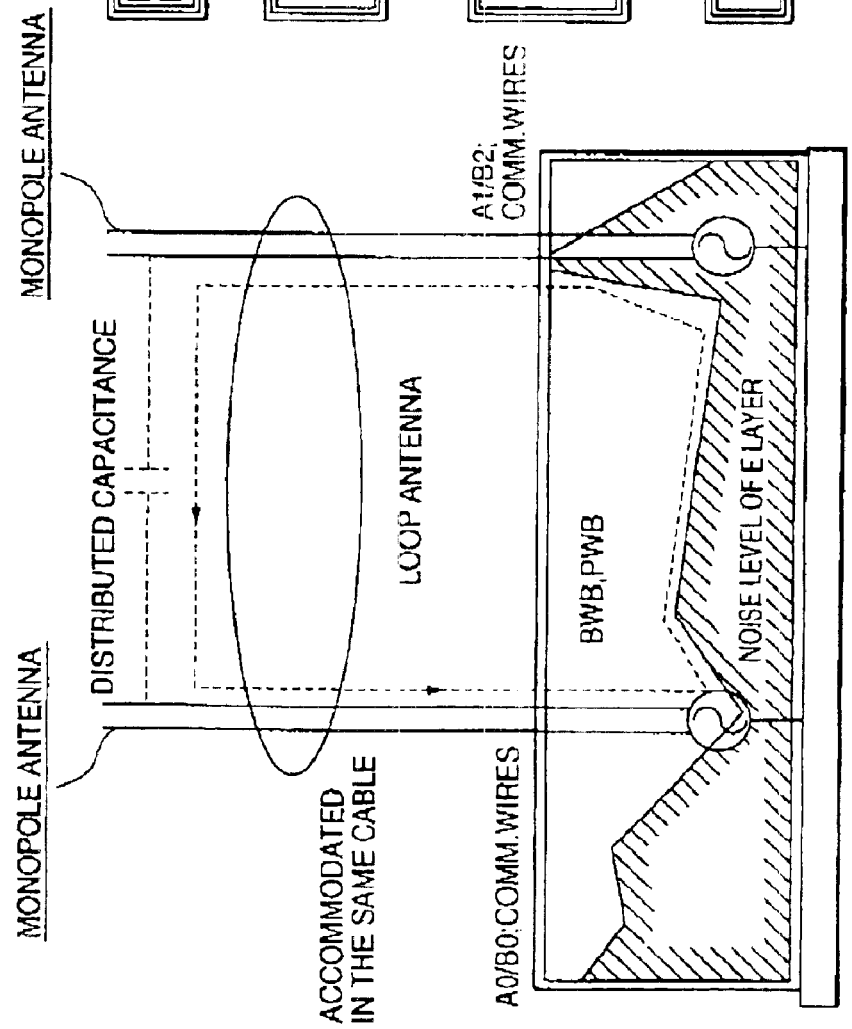
FIGS. 17A and 17B are diagrams explaining the second example of the first embodiment.
Figure 17B:
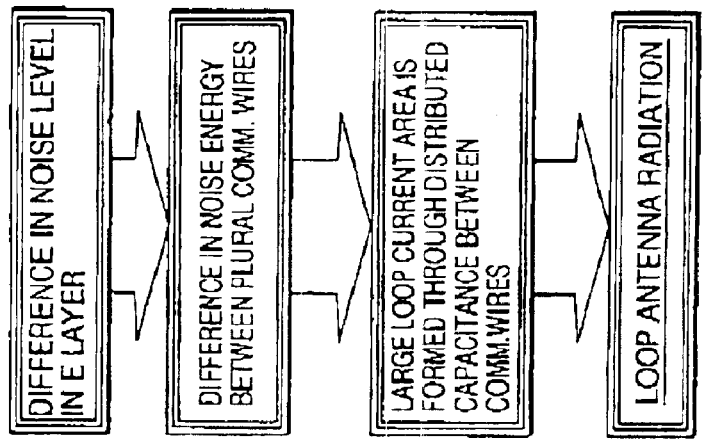

As shown in FIGS. 17A and 17B, there is a difference of noise level (peak value) between the E (earth) layers of the printed board (PWD) and backboard (BWB) depending on installation positions thereof. Such a noise level difference causes a difference of noise energy among plural communication wires, which forms a loop current area as a loop antenna to radiate noises. In other words, when the various communication wires having different noise levels are accommodated in a single cable, it is shown that the loop current flows to form a loop antenna through the distributed capacity between the different communication wires closely arranged in the single cable.

Figure 18:
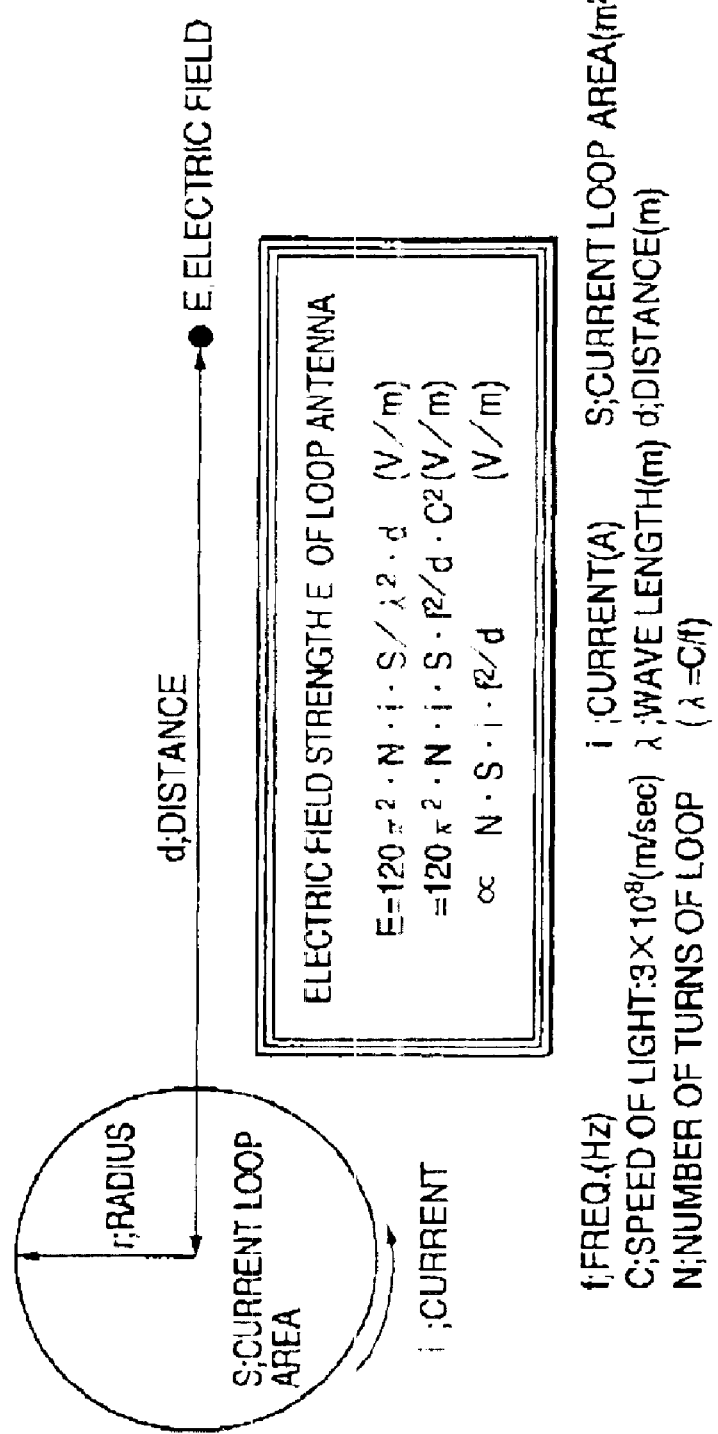
FIG. 18 is a diagram explaining the electric field strength of a loop antenna radiation in the second example of the first embodiment.

Referring to FIG. 18, electric field strength is obtained by the following equation:

$$E(V/m) \propto S \cdot i \cdot f^2 / d \qquad (14),$$

where S is a loop area, i is a loop current, f is a frequency, and d is distance from antenna.

Figure 19:
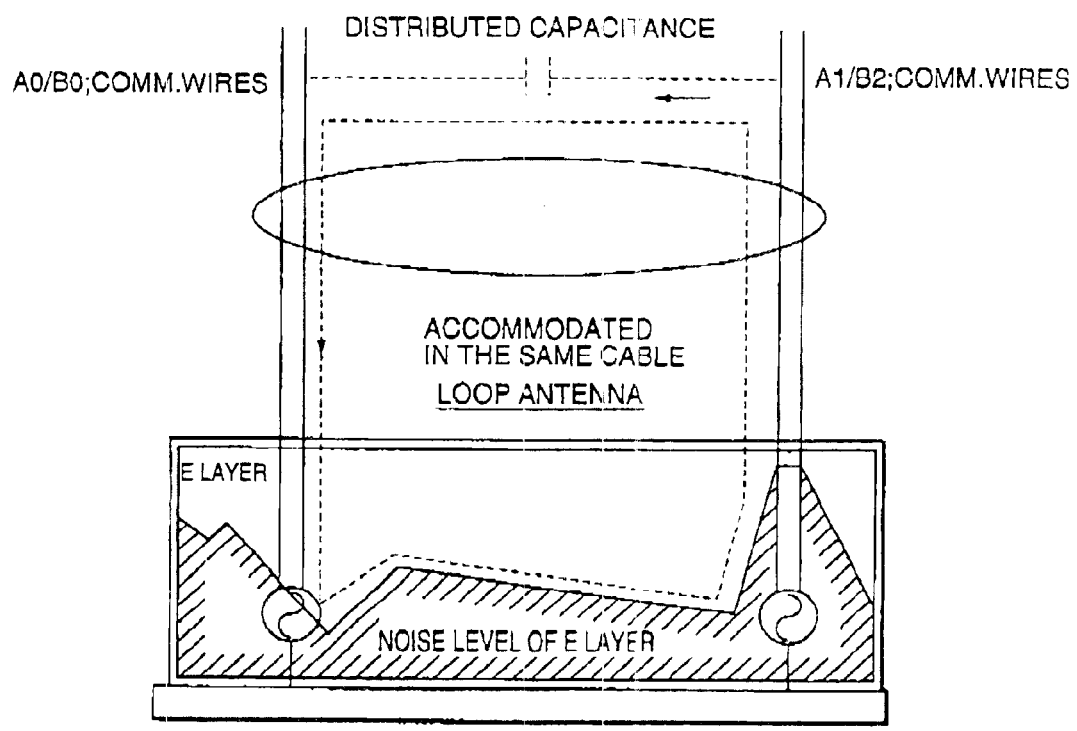
FIG. 19 is a diagram explaining the second example of the first embodiment.

As shown in FIG. 19, even if the loop current i is small, a large loop current area would increase radiant noise energy to the regulation value or more.

In order to decrease the loop antenna electric field strength E (V/m) to a sufficient small value, it is required to decrease S (loop area), i (loop current), and/or f (frequency), and/or to increase d (distance from antenna). According to the present invention, the loop current i flowing the loop area (S) is decreased in an equivalent manner.

Figures 20A, 20B:
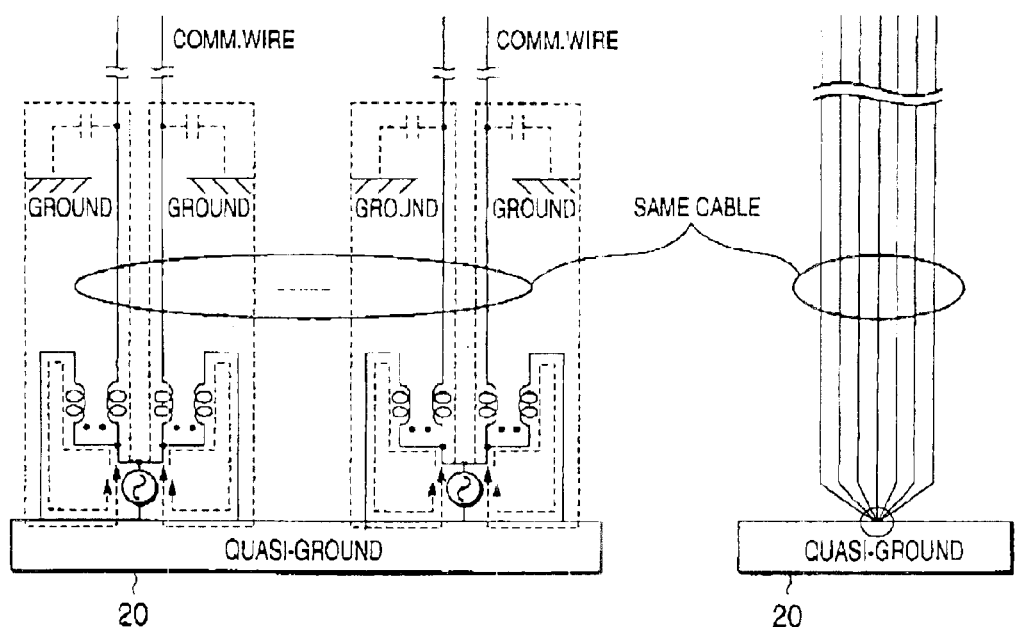
FIGS. 20A and 20B are diagrams explaining the second example of the first embodiment.

As shown in FIG. 20A, in order to prevent loop currents from flowing through the distributed capacitors formed between all communication wires accommodated in a single cable, it is necessary to make the common mode noise energies on all of the communication wires equal to each other, that is, to generate no difference in level and phase between them. By making the distributed capacitors formed between all communication wires accommodated in a single cable equal to the noise energy of the quasi-around 20. This state is equivalent to all of the communication wires being connected to one point of the housing 20, as seen in FIG. 20B, that is the quasi-ground by means of a screw, achieving an appropriate countermeasure against EMI.

Figure 1:
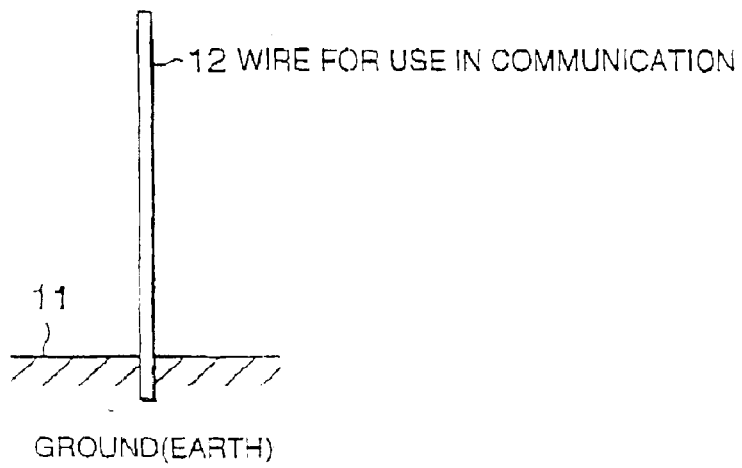
FIG. 1 is a schematic diagram for explaining the background of the invention.
Figure 2:
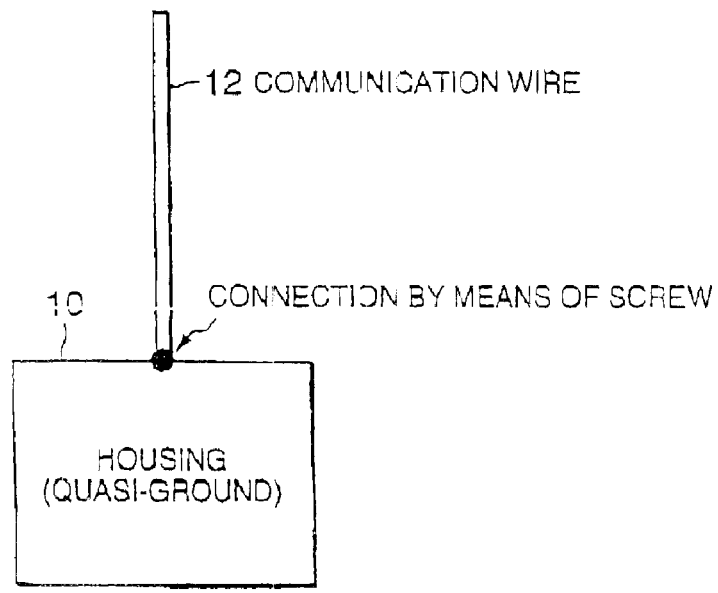
FIG. 2 is a schematic diagram for explaining a quasi-ground.
Figure 3:
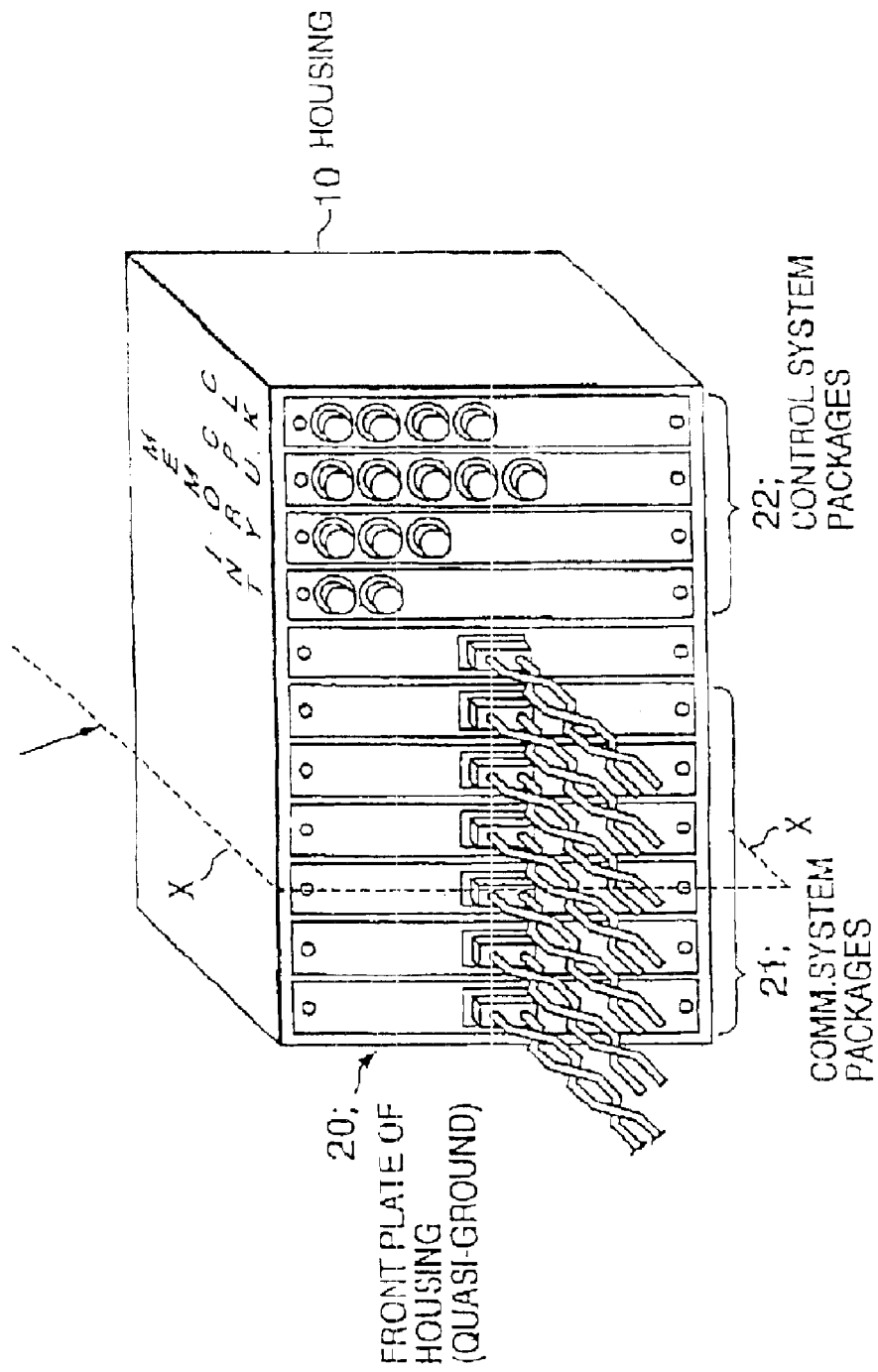
FIG. 3 is a perspective view of an electronic device having a quasi-ground surface at the front thereof.

As shown in FIG. 21A, since there is no difference in energy between all cables #1–#n extending from the device, it is possible to integrate all the cables #1–#n into the quasi-ground surface 20. As if equivalent to the arrangement as shown in FIG. 2, the noise energy of all communication wires in all cables of the device is equivalent to that of the quasi-ground and it can be regarded as to be fixed on the quasi-ground surface 20 by a screw as shown in FIG. 21B, a stable countermeasure against EMI within the regulation value can be economically realized without forming any loop antenna between communication wires.

To make the radiant noise energy from all communication wires falling into the regulation range in the state as shown in FIG. 21A, it is necessary to take such an appropriate EMI countermeasure that the energy of quasi-ground surface 20 is within the regulation value for all of the control system packages 22 and the communication system packages 21 in the housing 10.

The first embodiment as described above is directed to the case where, as shown in FIG. 13, the energy of quasi-ground surface 20 increases as the number of connected communication wires increases. That is, it is the case where the common mode radiation energy $E_{C1}$ from communication wire output pins 8H, 8J of communication LSI 3F and the common mode radiation energy $E_{C2}$ of the E (earth) pin 3E of communication LSI 3F are larger than the energy $E_{FG}$ on the quasi-ground surface 20 of common mode radiation energy 30 of housing 10. This case is represented by the relationship of $E_{C1}=E_{C2}>E_{FG}$.

Similar to the method described in Japanese Patent Application Unexamined Publication No. 11-307986, the present invention is applicable to the case of $E_{C1}=E_{C2}<E_{FG}$.

Third Example

Referring to FIG. 22, an electronic device has the housing 10 accommodating a plurality of communication system packages 21 and control system packages 22. The control system packages 22 include high-speed CPU package, memory package, high-speed clock package and so on, which have a large amount of radiant noise energy. A total of the radiant noise energy from these packages 21 an 22 appear in the front plate (quasi-ground 20) of the housing 10 via only the backboard thereof. The communication system packages 21 are separated from the control system packages 22 by the shielding plate 23 in order to reduce interference from the noise energy of the control system packages 22.

Figure 23:
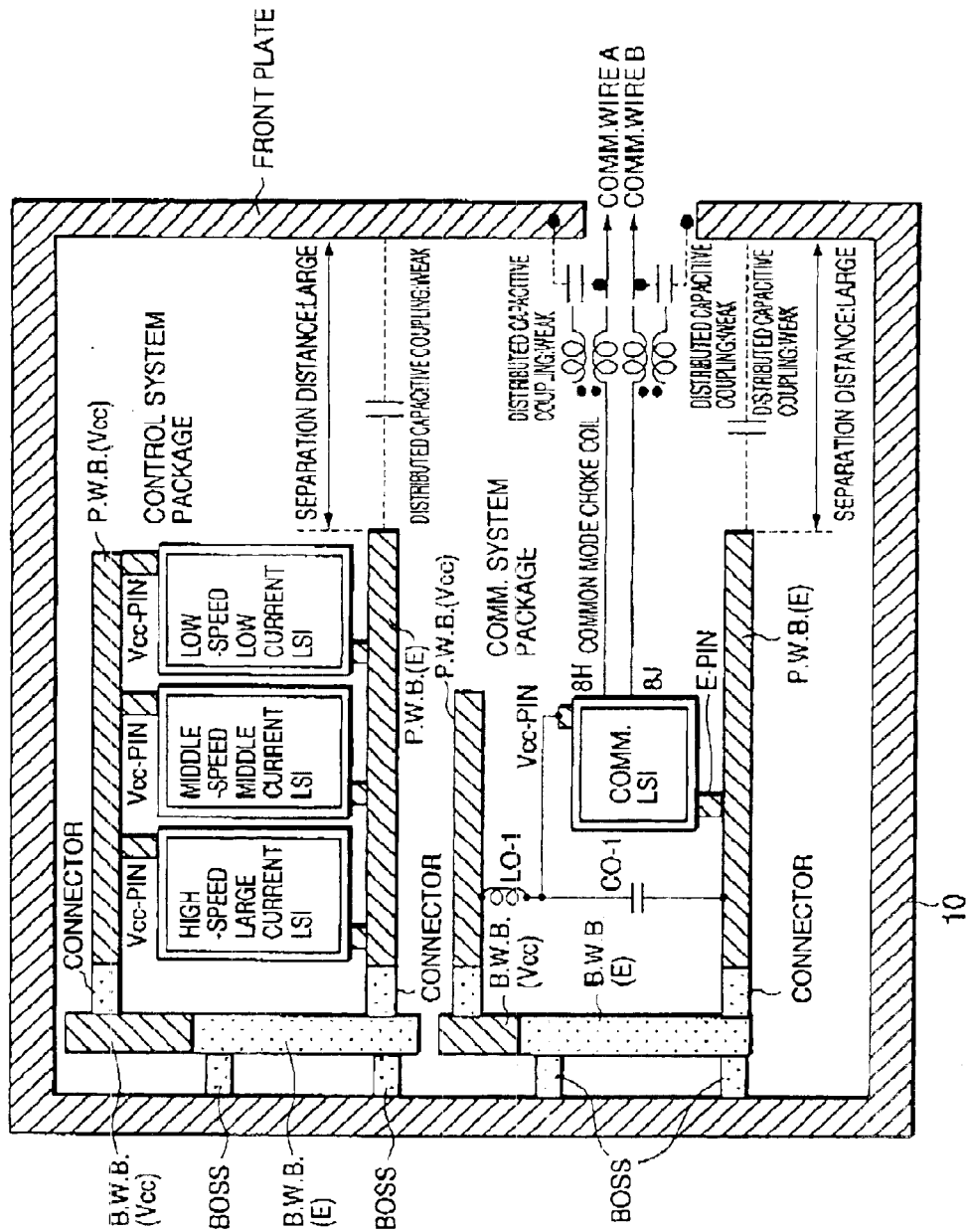
FIG. 23 is a sectional view of a device according to the third example of the first embodiment.

As shown in FIG. 23, the E (earth) on the printed board in a package (communication system package 21 or control system package 22) is provided at substantial distance from the inner wall of the housing 10 so as to prevent coupling caused by distributed capacitance between them. Only the common mode choke can be provided nearby the front plate. A small coupling effect caused by a floating capacitance existing between the common mode choke and the front plate is negligible. In such an arrangement, the radiant noise energy from the E (earth) of printed board for all packages flows from only the backboard (BWB) side to the housing 10.

Since the communication system packages operate at low-medium speeds with respect to the control system packages, a radiant noise energy level is small and therefore it is easy to make the energy level of E (earth) pin 3E of communication LSI 3F and of communication output pins 8H, 8J smaller than the energy level of the housing 10.

As described above, according to the method described in Japanese Patent Application Unexamined Publication No. 11-307986, the noise energy of communication wires is made smaller than that of the quasi-ground surface 20 and thereby the energy of the quasi-ground 20 is caused to flow into the communication wires, resulting in the energy of all the communication wires being equal to that of the quasi-ground 20. This method allows all communication wires to have no difference in noise energy with more reliability.

Second Embodiment

Next, another embodiment of the present invention will be described.

In general, a common mode choke is produced by winding a wire around a ferrite core. Such a choke has a withstand voltage of about 50V. If a higher withstand voltage is required, a ferrite bead is usually adopted.

Figure 24A:
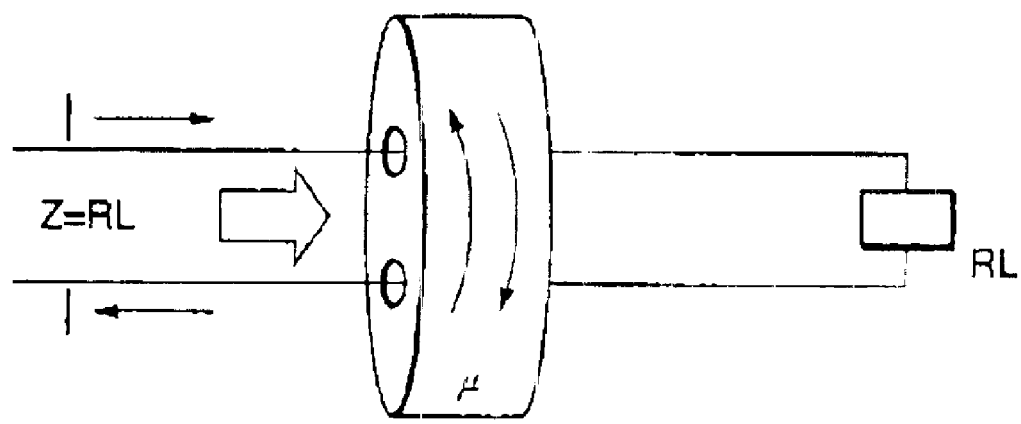
FIG. 24A is a diagram showing a ferrite bead when a normal mode signal flows.
Figure 24B:
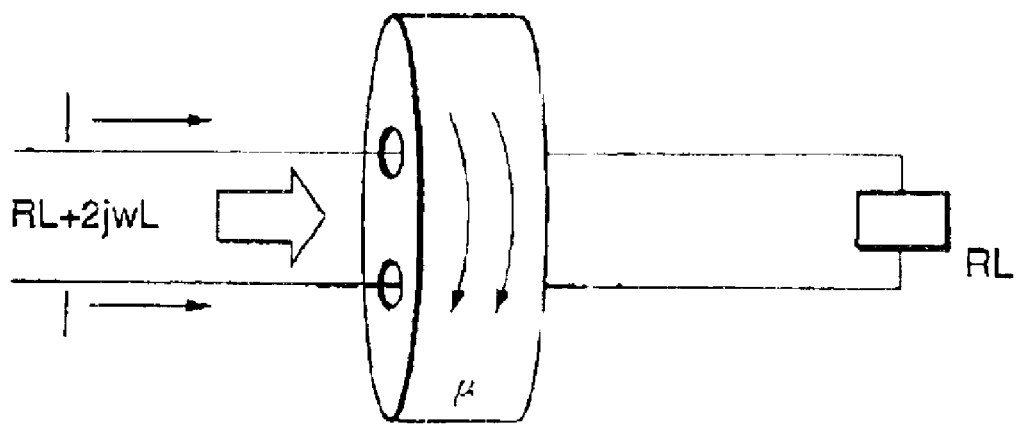
FIG. 24B is a diagram showing a ferrite bead when a common mode noise flows.

As shown in FIGS. 24A and 24B, a two-hole ferrite bead is adopted to pass two signal lines (communication wires 3H, 3J) through respective ones of the two holes thereof. Such an arrangement provides the suppression effect of common mode noises equivalent to that of the case as shown in FIGS. 11 and 12.

Assuming that a normal mode current I flows through the ferrite bead as shown in FIG. 24A, the load impedance viewed from the driver is not changed. In this case, the ferrite bead is operated as a common mode choke and is not magnetized by the load current.

When the common mode current I flows in a direction shown in FIG. 24B, the ferrite bead is operated as an induction device and the load impedance from the driver side increases by $2j\omega L$.

Therefore, the ferrite bead can suppress the common mode current without influencing the transmission signal.

First Example

Figure 25:
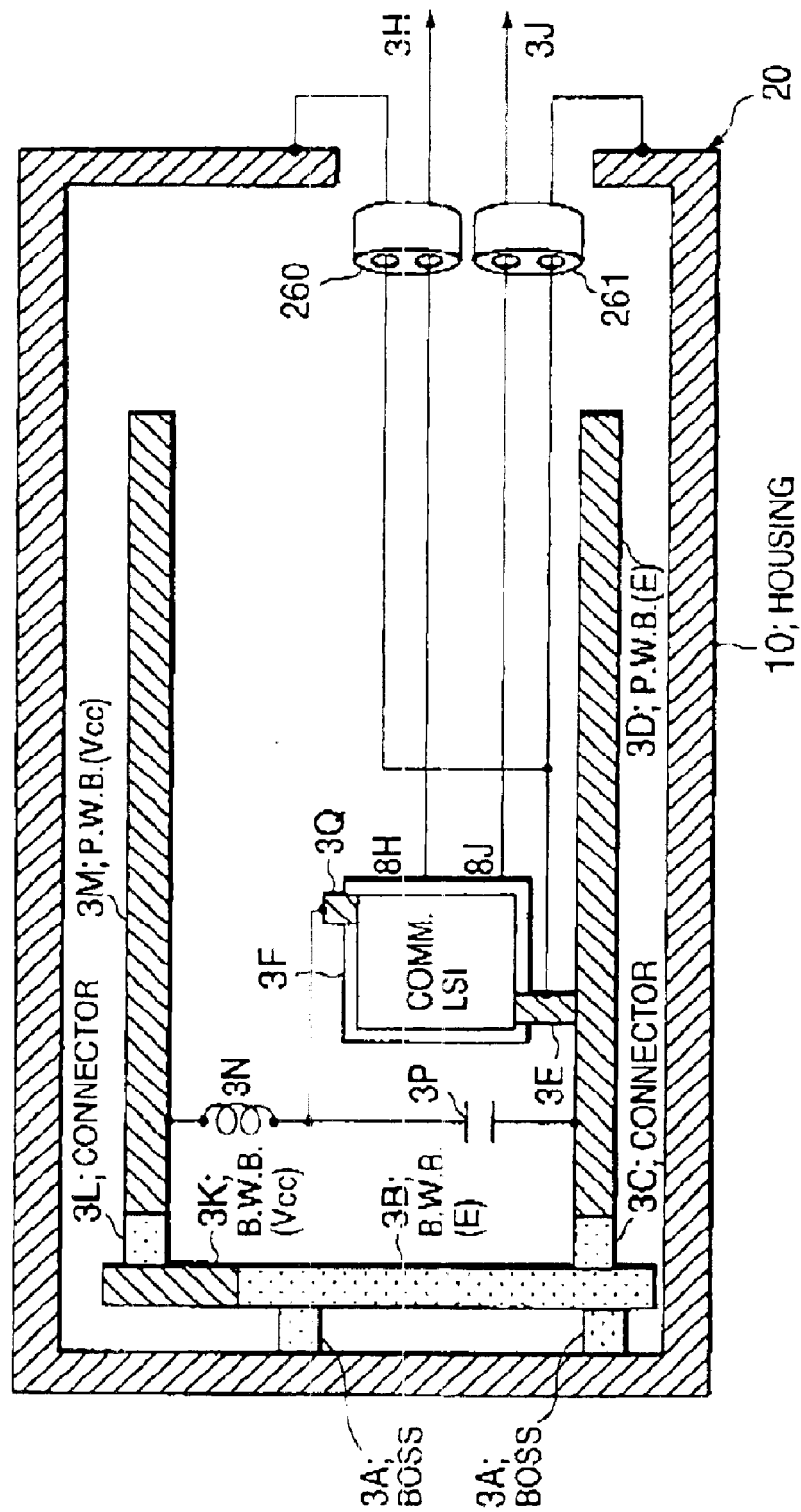
FIG. 25 is a sectional view of a device according to a first example of a second embodiment of the present invention.

As shown in FIG. 25, ferrite beads 260 and 261 are connected between the quasi-ground surface 20 and the E pin 3E of the communication LSI 3F. It is apparent from FIG. 10A that this example is formed by replacing the common mode chokes 80 and 81 of FIG. 10A with the ferrite beads 260 and 261.

In the second embodiment of the present invention as shown in FIG. 25, a signal transmitting wire connecting the communication output pin 8H of communication LSI 3F to the communication wire 3H is passed through one hole of the ferrite bead 260, and an E wire connecting the E (earth) pin 3E of the communication LSI 3F to the quasi-ground 20 is passed through the other hole of the ferrite bead 260. It is the same with the other ferrite bead 261.

Second Example

Figure 26:
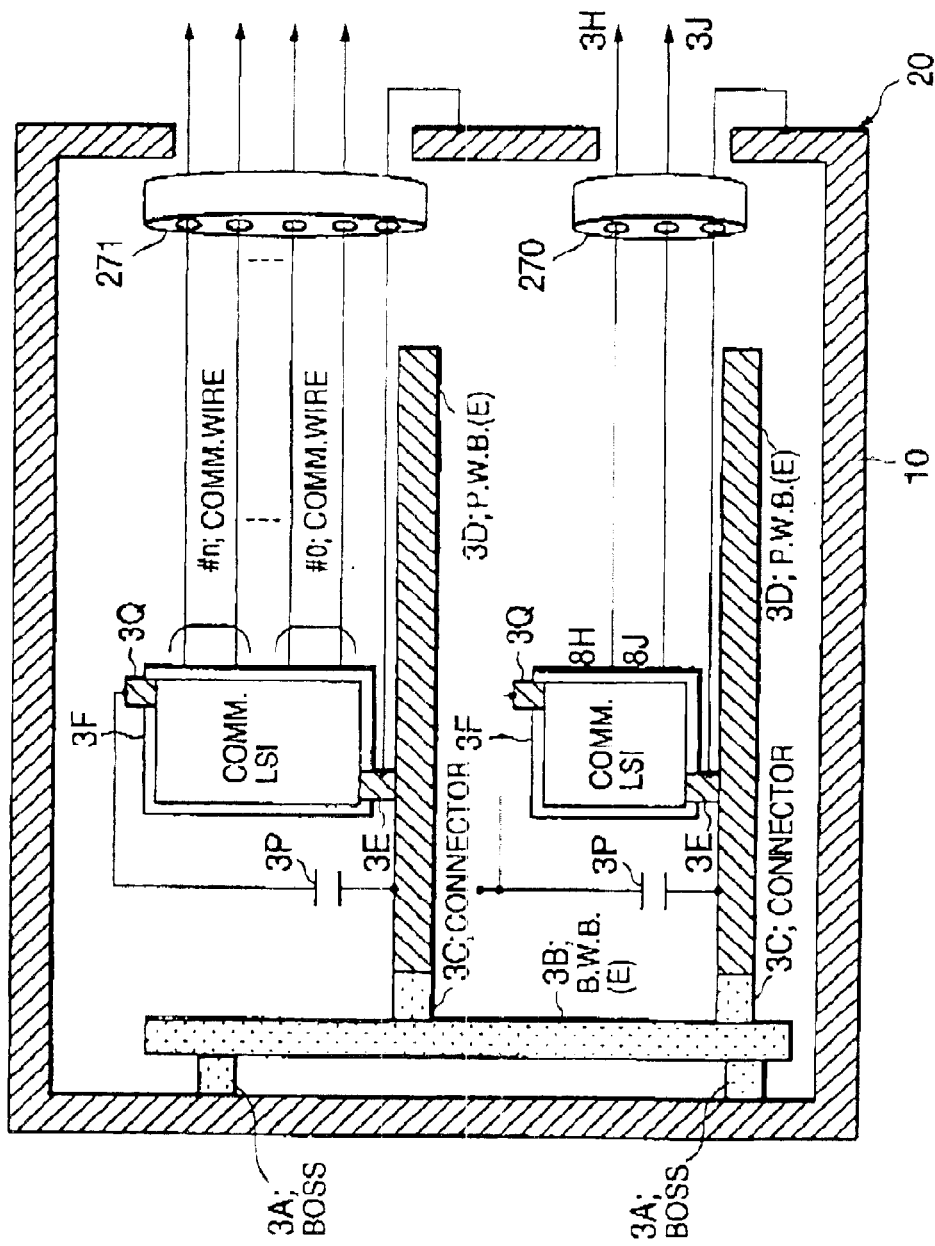
FIG. 26 is a sectional view of a device according to a second example of a second embodiment of the present invention.

Referring to FIG. 26, the E (earth) pin 3E and the communication wire pins 8H, 8J of a first communication LSI 3F are connected with a three-hole ferrite bead 270 to combine respective currents passing through the three-hole ferrite bead 260. In this manner, a single three-hole ferrite bead can be used in place of two two-hole ferrite beads as shown in FIG. 25 to suppress common mode currents without influencing the transmission signal. In this example, the number of ferrite beads can be decreased.

In the case where a second communication LSI 3F has a plurality of signal pins corresponding to respective ones of communication wires #0–#n and a single common E (earth) pin 3E, the E (earth) pin 3E and the signal pins are connected to a ferrite bead 271 having a necessary number (here, 2(n+1)+1) of holes. In this arrangement, the effect to suppress common mode currents without influencing transmission signals can be also obtained.

Third Example

Common mode chokes, each of which has a plurality of coils, can be employed in place of the ferrite beads 270, 271 as shown in FIG. 26.

Figure 27:
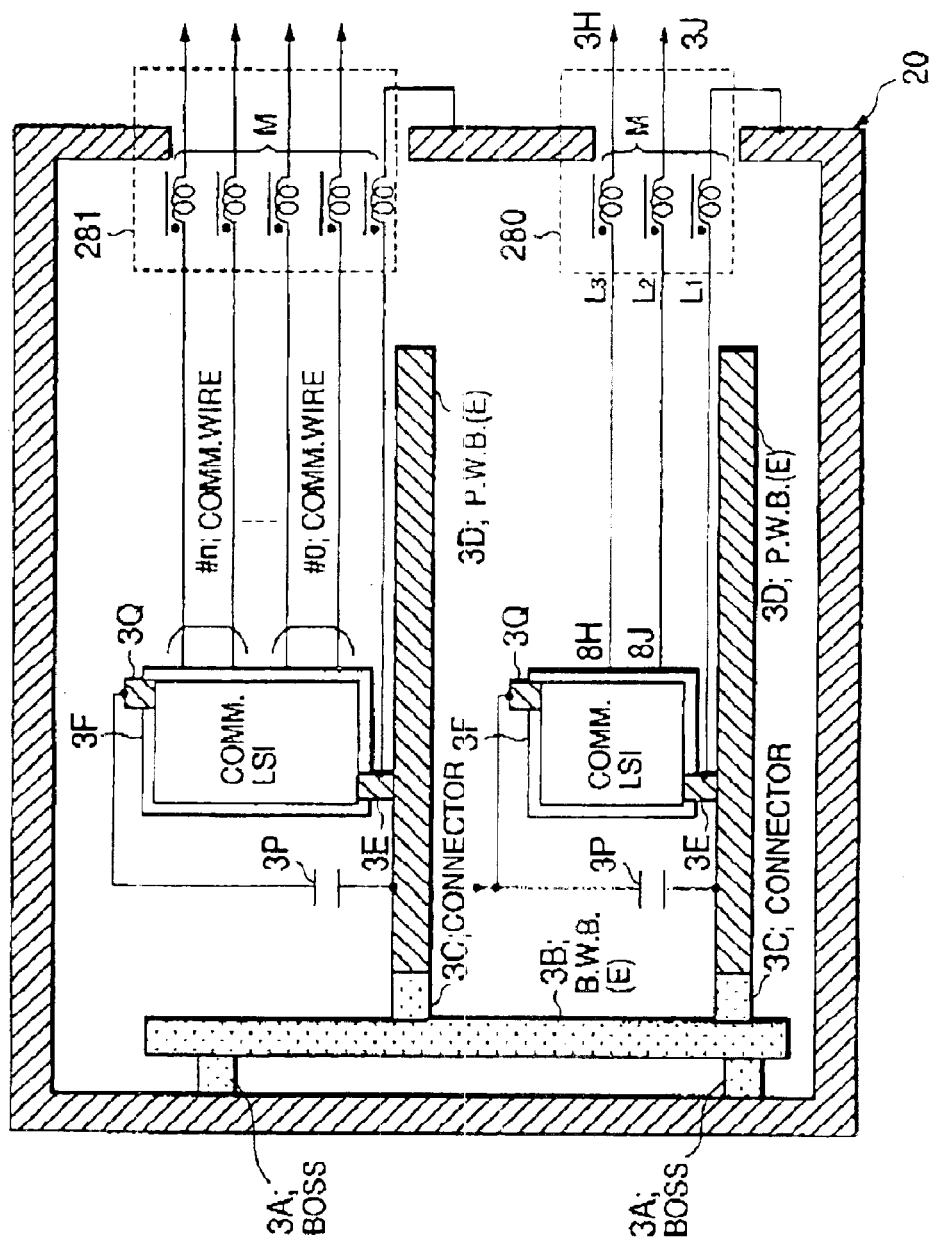
FIG. 27 is a sectional view of a device according to a third example of a second embodiment of the present invention.

Referring to FIG. 27, in a common mode choke 28C, a coil L1 is inserted to a wire for connecting the E pin 3E of communication LSI 3F with the quasi-ground surface 20 of housing, coil L2 is inserted between the communication wire 3J and the signal Fin 8J, and coil L3 is inserted between the communication wire 3H to the signal pin 8H. The respective coils L1, L2, and L3 have self-inductances L1, L2, and L3, and have a mutual inductance M.

Such an arrangement provides a more effective EMI suppression effect because the inductance of a coil decreases the common mode radiant noise more effectively compared with that of FIG. 26.

Third Embodiment

The above embodiments employ passive devices (common mode chokes and ferrite beads) as a means for implementing the present invention. Instead of passive devices, active devices may be used.

Figure 6:
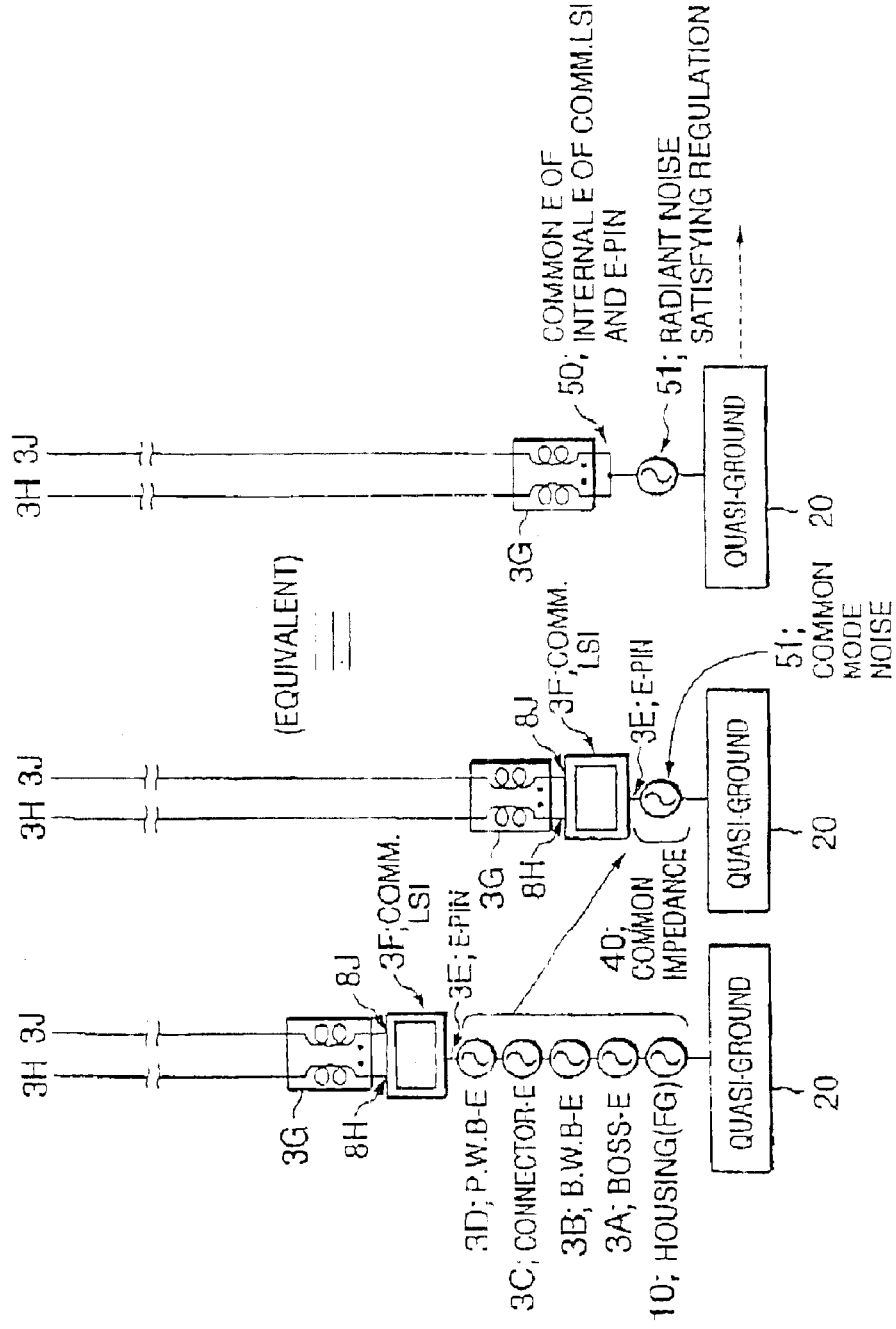
FIGS. 6A, 6B and 6C show circuit diagrams for explaining the common impedance.
Figure 7:
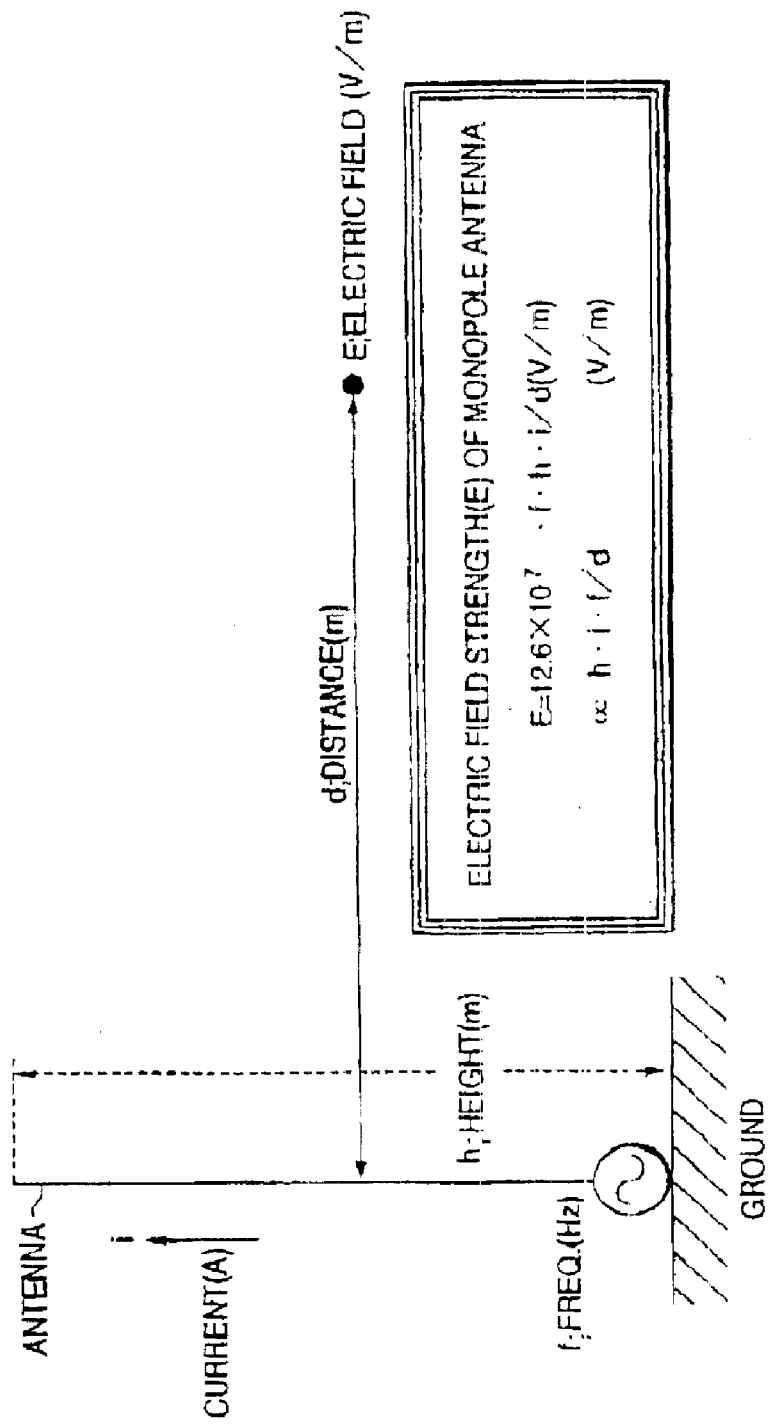
FIG. 7 is a diagram explaining the electric field strength of a monopole antenna.
Figure 28:
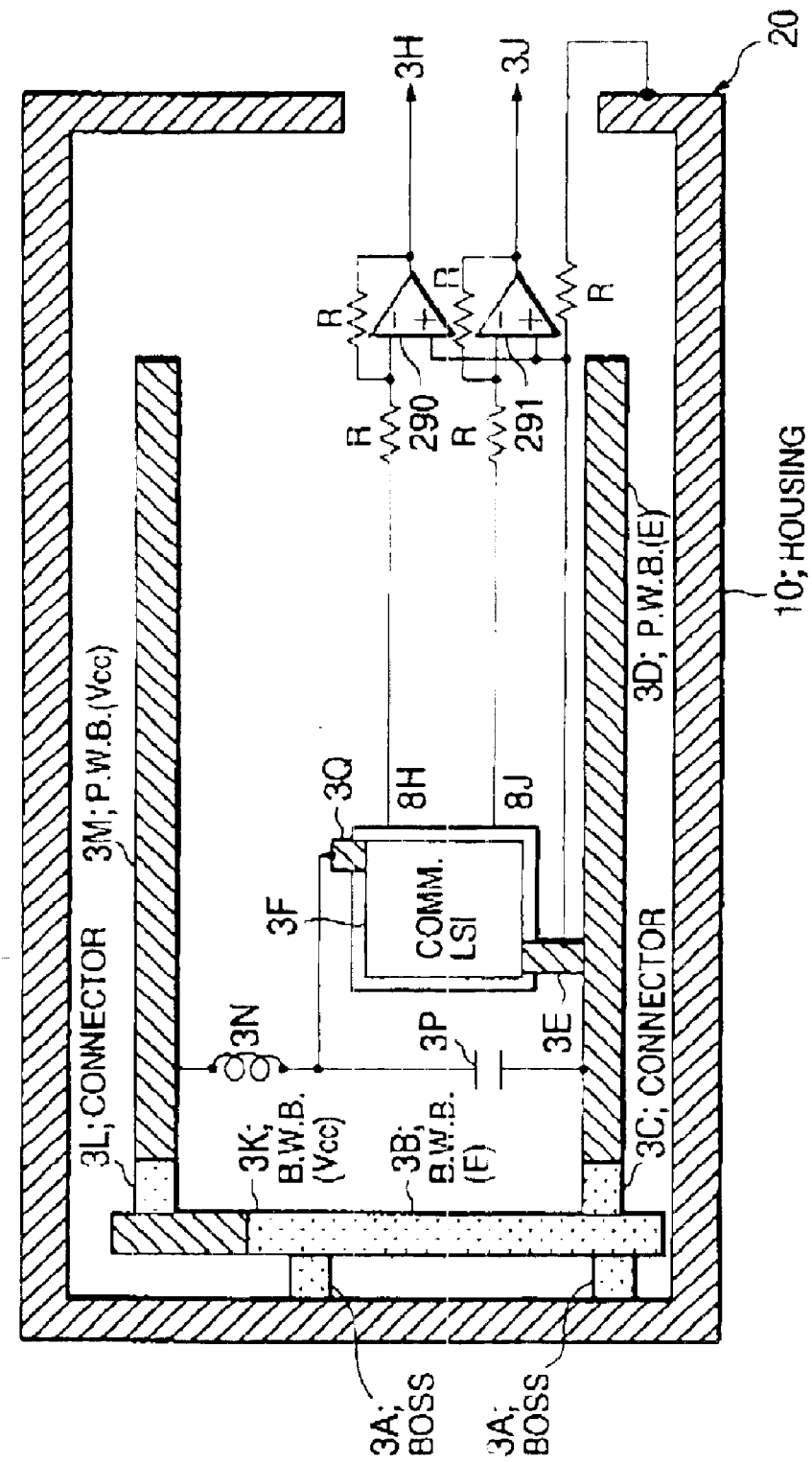
FIG. 28 is a sectional view of a device according to a third embodiment of the present invention.

Referring to FIG. 28, two operational amplifiers are employed as active devices to cancel the common mode noise 51 as shown in FIG. 6 from the communication wires 3H and 3J.

More specifically, the common mode noise 51 between the E (earth) pin 3E of communication LSI and the quasi-ground surface 20 is input commonly to non-inverting input terminals of the operational amplifiers 290 and 291.

The communication wire output pin 8H of communication LSI 3F is connected to the inverting input terminal of the operational amplifier 290 through a first resistor R. Further, the inverting input terminal and the output terminal of the operational amplifier 290 are connected through a second resistor R.

Similarly, the communication wire output pin 8J of communication LSI 3F is connected to he inverting input terminal of operational amplifier 291 through a third resistor R. Further, the inverting input terminal and the output terminal of the operational amplifier 291 are connected through a fourth resistor R.

All the first to fourth resistors of operational amplifiers 290, 291 have the same resistance R. In such a circuit arrangement, an input signal of an operational amplifier is inverted in phase only and is not amplified or attenuated. As a result, the output of the operational amplifier has the same level as the input.

In the present invention, a voltage of common mode noise 51 existing in the E (earth) pin 3E of communication LSI 3F is applied to the non-inverting input terminals of operational amplifiers 290, 291. The voltage of common mode noise 51 and the normal mode signals, which are superposed on the communication wire output pins 8H, 8J of communication LSI 3F, are applied to the inverting input terminals of operational amplifiers 290, 291, respectively.

Since an operational amplifier, as known well, operates such that a potential on the inverting input terminal is equal to that on the non-inverting input terminal, the voltage of common mode noise 51, which is included in output signals on the signal output pins 8H, 8J of communication LSI 3F, is consequently canceled. That is, it shows that even the circuit, employing operational amplifiers can realize the same EMI suppression effect as that of the above embodiments.

Figures 4A, 4B:
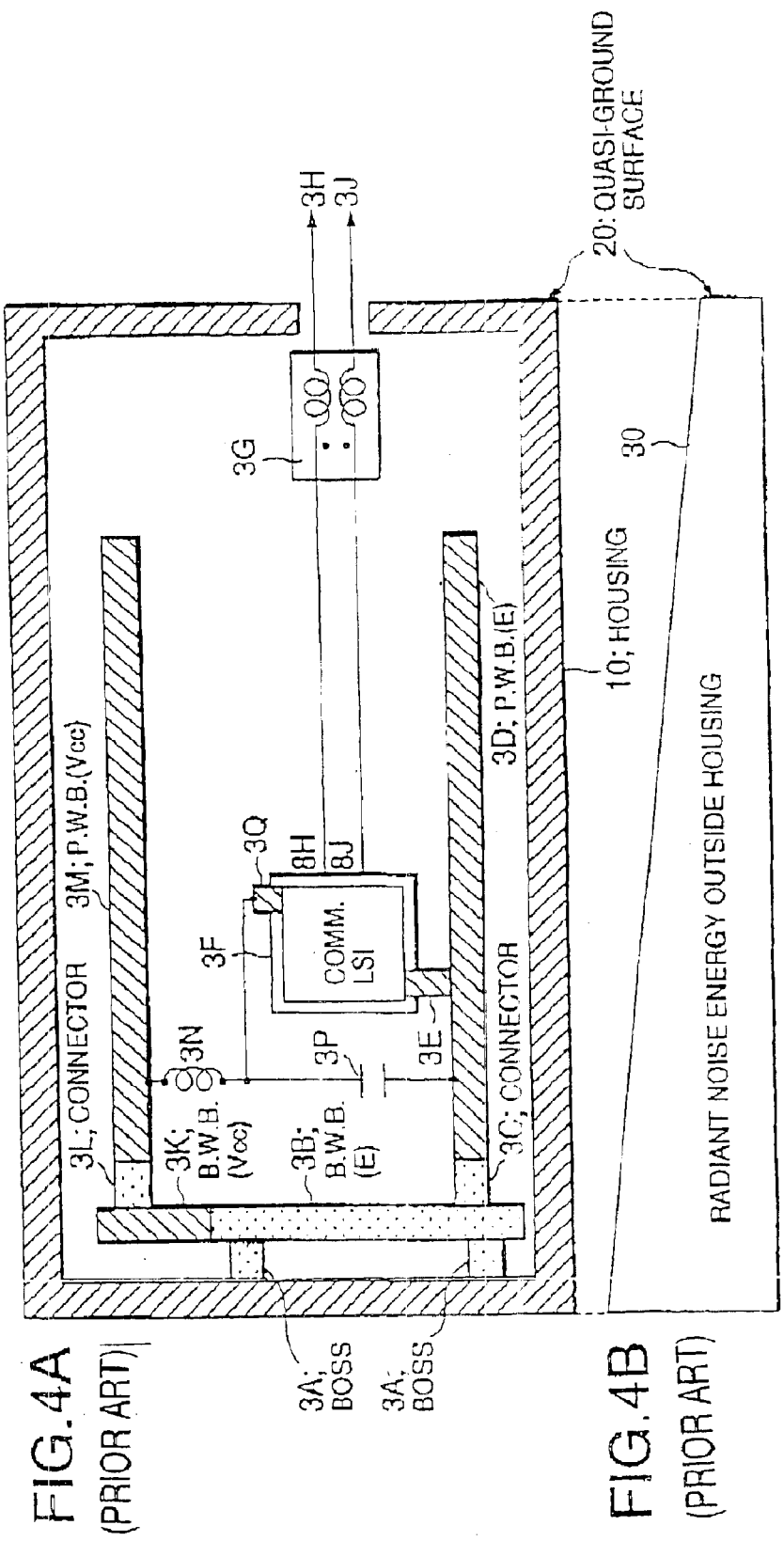
FIG. 4A is a sectional view of the electronic device taken along the X—X line of FIG. 3.
FIG. 4B is a diagram showing a change of radiant noise energy outside the housing.

The + and −power supply voltages of operational amplifiers 290, 291 described in this case are obtained by using an inductance and a capacitor, which are similar to the inductance 3N and the capacitor 3P for decoupling as shown in FIG. 4A. Here, sufficient EMI suppression is subject to the power supply voltages to eliminate common mode noise 51 from the power supply voltage to the extent that the noise level of the power supply voltage is substantially equal to the level of the quasi-ground surface 20.

Although a metallic housing is taken as an example in the above embodiments, a mold or plastic housing may be used instead of the metallic housing. In this case, a portion having the smallest noise level within the EMI regulation value is determined as the quasi-ground. The present invention can be applied to such a case by replacing the quasi-ground surface 20 in the above embodiments with the determined portion.

The relationship between the present invention and the previously proposed method described in Japanese Patent Application Unexamined Publication No. 11-307986 will be briefly described.

Figure 29A:
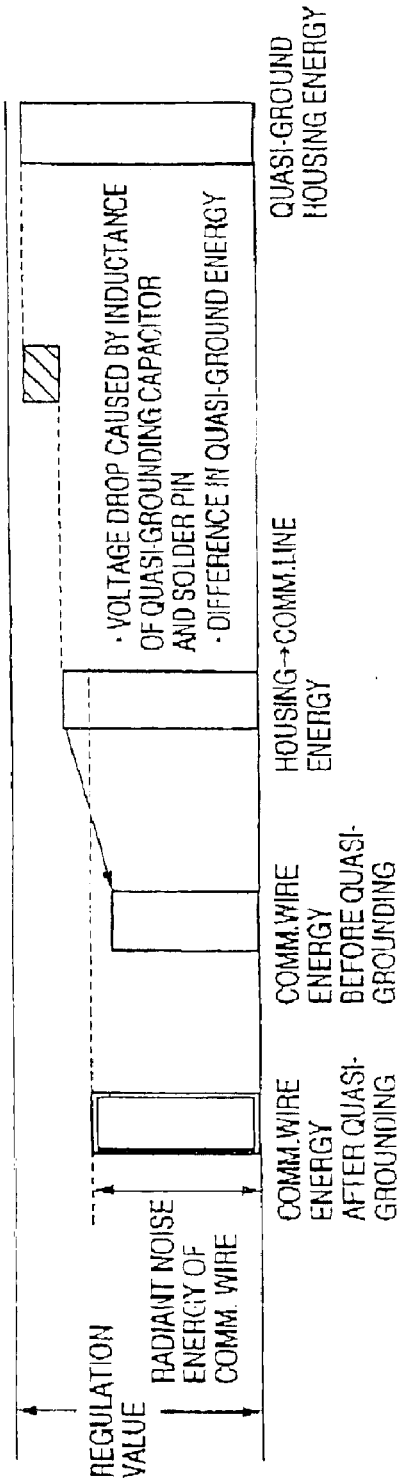
FIGS. 29A and 29B are diagrams explaining the prior art method disclosed in Japanese Patent Application Unexamined Publication No. 11-307986.
Figure 29B:
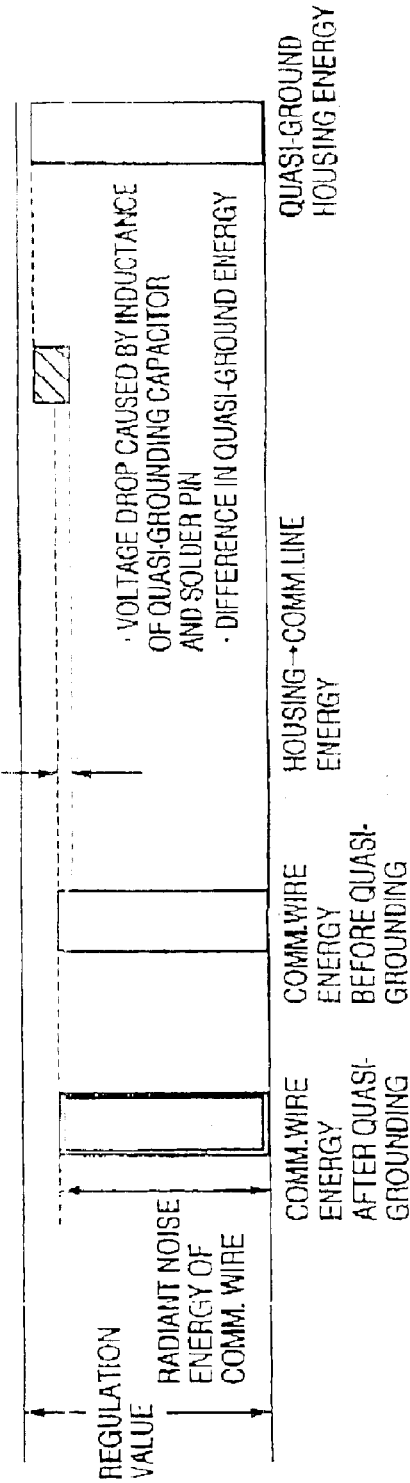

As shown in FIG. 29, in the previously proposed method, the radiant noise energy of communication wire is reduced within the noise energy of the quasi-grounded housing. A plurality of wires with smaller radiant noise energy than that of the quasi-grounded housing are connected to the quasi-grounded housing through the quasi-grounding capacitor. Accordingly, a current flows from the housing side having the high noise energy level to the wire side having the low noise energy level to reduce the noise energy level of he quasi-grounding point of housing and to prevent an increase of the high-frequency noise energy regardless of the number of communication wires.

As shown in FIG. 29, since a voltage drop caused by impedance (inductance) components including quasi-grounding member, solder and pattern and differences of energy on the quasi-ground surface depending on positions of housing front plate is existed, the quasi-grounding is the ideal model, and in this case, as described above, the difference of energy between the communication wires is generated. However, since the small difference in this case is within the regulation value, the radiation level of current loop antenna can be ignored.

Figure 30A:
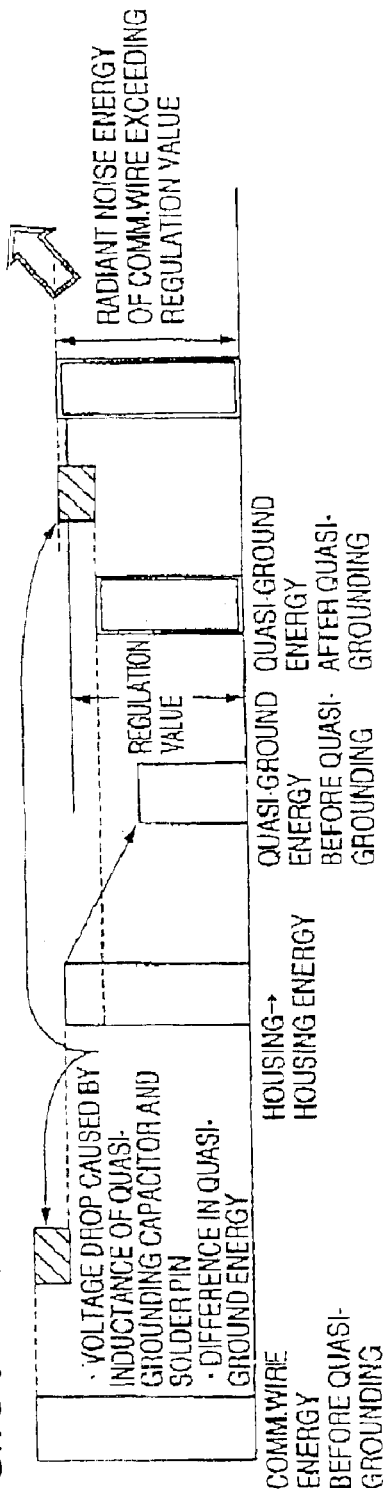
FIGS. 30A and 30B are diagrams explaining a prior art method different from the method disclosed in Japanese Patent Application Unexamined Publication No. 11-307986.
Figure 30B:
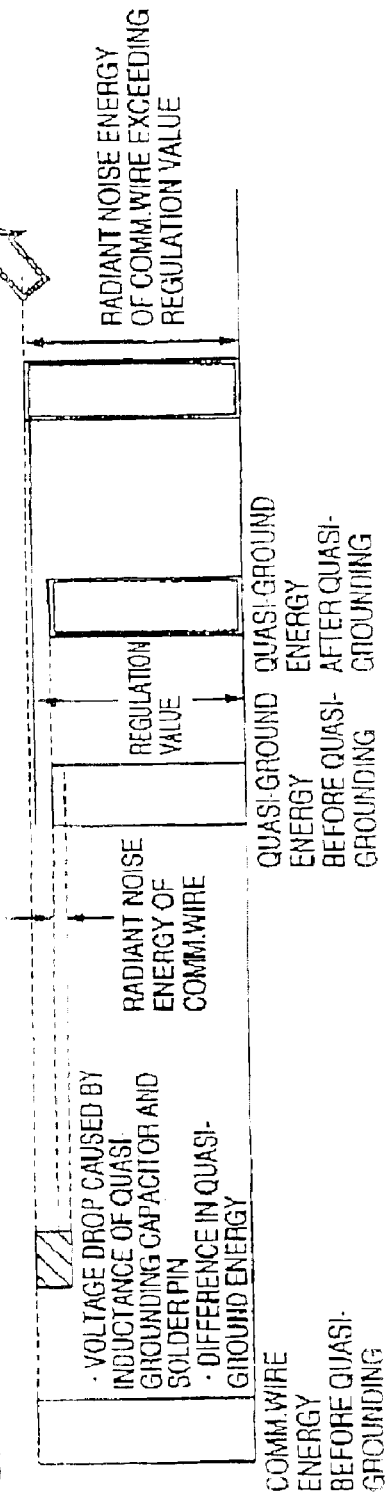

As shown in FIG. 30, on the other hand, in the case where the radiant noise energy of communication wires is larger than that of the quasi-ground surface, some communication wires have the noise energy in excess of the regulation value. In this case, as described above, the radiant noise energy of communication wires is forced to be equal to that of the quasi-ground surface by a common mode choke and the like, and thereby the current loop generated by the difference of common mode energy between the communication wires across the long distance is not formed. As shown In FIG. 29, in the case of such a composition that can reduce the radiant noise energy with the increase of number of communication wires, the EMI countermeasure can be easily realized.

Basic Operation and Advantages

Finally, a basic operation of the present invention will be described briefly taking as an example the case using common mode chokes.

Figure 31:
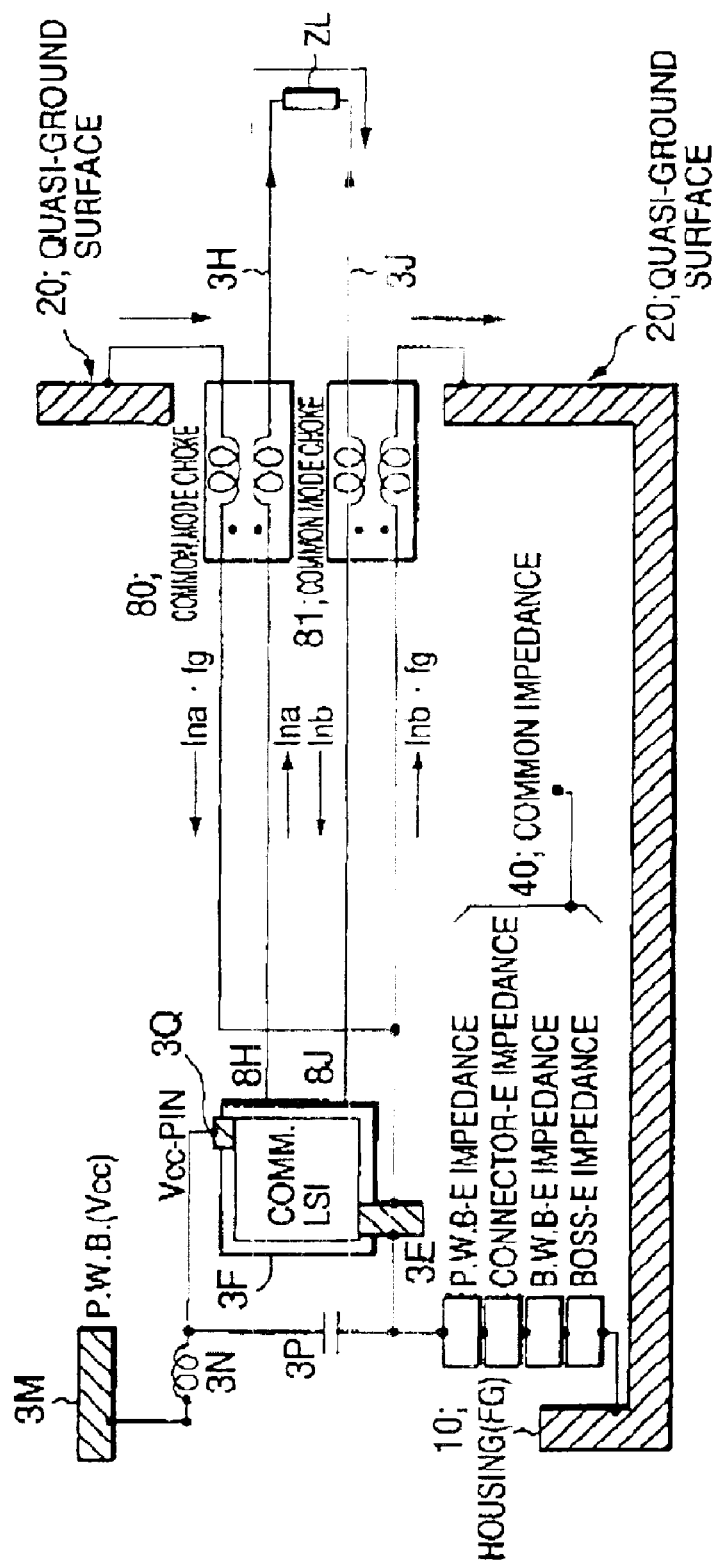
FIG. 31 is a diagram explaining the principle of the present invention.

Referring to FIG. 31, the E (earth) pin 3E of the communication LSI 3F is connected to the housing 10 (quasi-ground 20) via the printed board (PEB) mounted with the communication LSI 3F, the back board connector to connect the PWB to a back board (BWB), the BWB, and bosses. The communication output pins 8H and 8J of the communication LSI 3F are connected to the load ZL through the common mode chokes 80 and 81, respectively.

More specifically, the common mode choke 80 has two coils having a mutual inductance, one of which connects the output pin 8H of the LSI 3F to the load ZL, and the other of which connects the E (earth) pin 3E to the quasi-ground surface 20. Similarly, the common mode choke 81 has two coils having a mutual inductance, one of which connects the output pin 8J of the LSI 3F to the load ZL, and the other of which connects the E (earth) pin 3E to the quasi-ground surface 20. The common mode chokes 80 and 81 are provided at positions near the quasi-ground of the housing 10. Here, the common mode chokes 80 and 81 have the same characteristics.

As shown in FIG. 31, currents Ina and −Inb for a normal mode signal with the same level flows through the communication wires 3H and 3J in opposite directions to each other. Here, the negative sign "−" of a current value indicates that it flows in the opposite direction. The current Ina flowing through one coil of the common mode choke 80 causes an electromotive force to flow a current −Ina·fg from the quasi-ground 20 to the E pin 3E through the other coil of the common mode choke 80. Similarly, the current −Inb flowing through one coil of the common mode choke 81 causes an electromotive force to flow a current Inb·fg from the E pin 3E to the quasi-ground 20 through the other coil of the common mode choke 81.

Since $|Ina|=|-Inb|$, $|-Ina·fg|=|-Inb·fg|$, $|Ina|=|-Ina·fg|$, $|-Inb|=|Inb·fg|$, $|Ina|=|-Inb|=|-Ina·fg|=|-Inb|=|Inb·fg|$. Accordingly, no inductance is generated for a normal mode signal, resulting in no attenuation of the normal mode signal.

Further, the current Ina·fg and the current Inb·fg that flow between the quasi-ground 20 and the E (earth) pin 3E of the communication LSI 3F cancel each other out, so that no current flows through the common mode impedance 40. Accordingly, the common mode no se level is not affected.

As described above, according to the present invention, one coil of a common mode choke having at least two coils therein is inserted between communication wires and the other coil is inserted between the quasi-ground surface of housing and the earth pin of a communication LSI. Alternatively, an inexpensive device such as a ferrite bead may be used instead of the common mode choke, resulting in reduced cost of the device. Employing such a circuit, the common mode radiant noise which is generated between the earth pin of communication LSI and the housing can be eliminated effectively without attenuating a normal mode signal level on the communication wires.

What is claimed is:

1. A method for suppressing a radiant noise of an electronic circuit having at least one signal transmission wire connected thereto, wherein the electronic circuit includes an electronic device having an earth terminal and at least one signal terminal, the earth terminal being connected to a housing of the electronic circuit via a common mode impedance, comprising the steps of:
   forming a plurality of current paths corresponding to one of said at least one signal transmission wire;
   transmitting an output signal of an electronic device to a corresponding signal transmission wire through a corresponding one of the current paths;
   flowing a current between an earth terminal of the electronic device and a quasi-ground through said one path; and
   radiating noise energy from the quasi-ground into said at least one signal transmission wire through the plurality of current paths to increase a noise level of said at least one signal transmission wire so that a noise level of said at least one signal transmission wire is equal to a noise level of the quasi-ground.

2. The method according to claim 1, wherein said plurality of current paths are formed by a common mode choke having a plurality of coils corresponding to respective ones of the current paths.

3. The method according to claim 2, wherein the current flows in a first coil of the plurality of coils of the common mode choke and the output signal flows in a second coil of the plurality of coils of the common mode choke, so that an energy of the at least one signal transmission wire is equal to that of the quasi-ground so that the at least one signal transmission wire is equivalently fixed to the quasi-ground by a single screw.

4. The method according to claim 2, wherein the common mode choke is provided at a position near a plate of the quasi-ground from which the signal transmission wire extends outside of the housing.

5. The method according to claim 1, wherein said plurality of current paths are formed by a respective resistor and at least one operational amplifier, which correspond to respective ones of the current paths, wherein
   the resistor is inserted one of the plurality of current paths to generate a reference voltage from the current flowing in said one of said plurality of current path, and
   said at least one operational amplifier inputs the reference voltage at a non-inverting input terminal thereof.

6. The method according to claim 1, wherein there are a plurality of said at least one transmission wire, said plurality of signal transmission wires are accommodated in a single cable, wherein the plurality of signal transmission wires are equivalently fixed to the quasi-ground at a single point to suppress a radiant noise caused by a current loop antenna equivalently formed between the plurality of signal transmission wires.

7. The method according to claim 1, wherein the noise energy radiates from the quasi-ground to said at least one signal transmission wire, so that a radiant noise energy is not increased independently of a number of signal transmission wires.

8. The method according to claim 1, wherein the electronic device is an integrated circuit, wherein the common mode impedance includes impedances of connecting members connected between the earth terminal of the integrated circuit and the housing.

9. The method according to claim 8, wherein the integrated circuit is a communication LSI, wherein one of the at least one signal transmission wire extends from the housing to outside of the housing and is connected to a communication signal output terminal of the communication LSI.

10. The method according to claim 1, wherein said quasi-ground is set to a radiant noise energy level equal to or smaller than an EMI regulation value.

11. An electronic apparatus comprising:
   a housing having at least one signal transmission wire extending outside the housing;
   an electronic device having an earth terminal and at least one signal terminal corresponding to the at least one signal transmission wire, wherein the earth terminal is connected to the housing via a common mode impedance;
   at least one common mode choke having a plurality of coils having a mutual inductance, wherein
   one of the plurality of coils connects a signal terminal of the electronic device to a corresponding signal transmission wire; and another one of the plurality of coils connects the earth terminal of the electronic device to a quasi-ground surface of the housing, wherein noise energy radiates from said quasi-ground into said at least one signal transmission wire through said at least one common mode choke to increase a noise level of said at least one signal transmission wire so that a noise level of said at least one signal transmission wire is equal to a noise level of said quasi-ground.

12. The electronic apparatus according to claim 11, wherein a front plate from which the at least one signal transmission wire extends is the quasi-ground.

13. The electronic apparatus according to claim 11, wherein the common mode choke is provided at a position near a plate of the quasi-ground from which the at least one signal transmission wire extends to outside.

14. The electronic apparatus according to claim 11, wherein the electronic device has the earth terminal and said at least one terminal includes first and second signal terminals corresponding respectively to first and second signal transmission wires that comprise said at least one signal transmission wire, wherein said at least one common mode choke comprises a first common mode choke having first and second coils having a mutual inductance, wherein the first coil connects the first signal terminal of the electronic device to the first signal transmission wire; and the second coil connects the earth terminal of the electronic device to a quasi-ground surface of the housing, and wherein said at least one common mode choke further comprises a second common mode choke having third and fourth coils having a mutual inductance, wherein the third coil connects the second signal terminal of the electronic device to the second signal transmission wire; and the fourth coil connects the earth terminal of the electronic device to the quasi-ground surface of the housing, wherein the first and second common mode chokes reduce a common mode radiant noise generated by the common mode impedance without affecting a normal mode signal flowing through the first and second signal transmission wires in opposite directions to each other.

\* \* \* \* \*